United States Patent
Ozawa et al.

(10) Patent No.: US 7,879,658 B2
(45) Date of Patent: Feb. 1, 2011

(54) SEMICONDUCTOR DEVICE AND METHOD FOR MANUFACTURING THE SAME

(75) Inventors: Yoshio Ozawa, Yokohama (JP); Ichiro Mizushima, Yokohama (JP); Takashi Suzuki, Yokohama (JP); Hirokazu Ishida, Yokohama (JP); Yoshitaka Tsunashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 524 days.

(21) Appl. No.: 12/040,224

(22) Filed: Feb. 29, 2008

(65) Prior Publication Data
US 2008/0211004 A1 Sep. 4, 2008

(30) Foreign Application Priority Data
Mar. 1, 2007 (JP) ............................. 2007-051792

(51) Int. Cl.
*H01L 21/00* (2006.01)
*H01L 29/04* (2006.01)
(52) U.S. Cl. .................... 438/150; 257/E27.112; 257/E29.292; 257/E21.683; 257/627
(58) Field of Classification Search ............ 257/627, 257/E27.112, E29.292, E21.683; 438/150
See application file for complete search history.

(56) References Cited

U.S. PATENT DOCUMENTS

| | | | |
|---|---|---|---|
| 2006/0237706 | A1 | 10/2006 | Enda et al. |
| 2007/0102749 | A1 | 5/2007 | Shirota et al. |
| 2007/0298594 | A1 | 12/2007 | Mizushima et al. |
| 2008/0157092 | A1 | 7/2008 | Arai et al. |

FOREIGN PATENT DOCUMENTS

| | | |
|---|---|---|
| JP | 07-99258 | 4/1995 |
| JP | 2002-289810 | 10/2002 |

*Primary Examiner*—Evan Pert
(74) *Attorney, Agent, or Firm*—Finnegan, Henderson, Farabow, Garrett & Dunner, L.L.P.

(57) ABSTRACT

A semiconductor device includes a silicon crystal layer on an insulating layer, the silicon crystal layer containing a crystal lattice mismatch plane, a memory cell array portion on the silicon crystal layer, the memory cell array portion including memory strings, each of the memory strings including nonvolatile memory cell transistors connected in series in a first direction, the memory strings being arranged in a second direction orthogonal to the first direction, the crystal lattice mismatch plane crossing the silicon crystal along the second direction without passing under gates of the nonvolatile memory cell transistors as viewed from a top of the silicon crystal layer, or crossing the silicon crystal along the first direction with passing under gates of the nonvolatile memory cell transistors as viewed from the top of the silicon crystal layer.

11 Claims, 25 Drawing Sheets

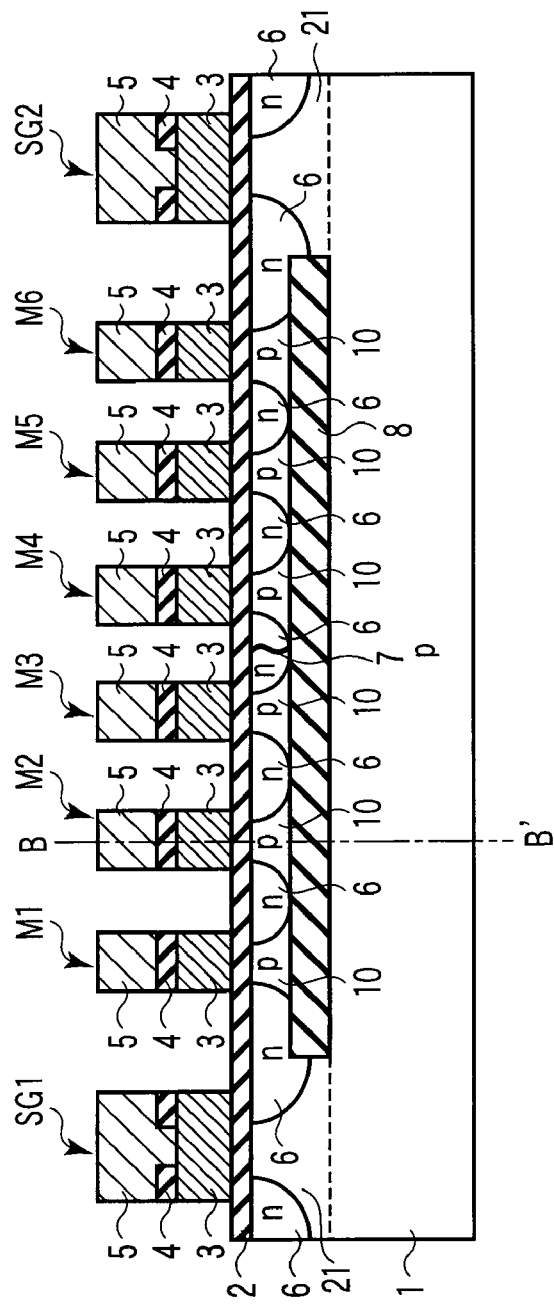
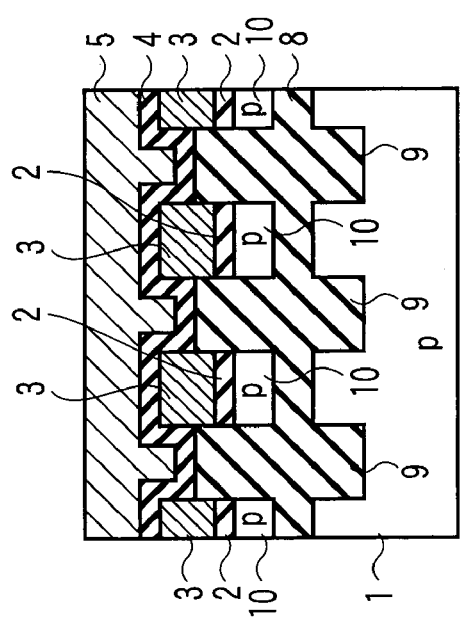
FIG. 2A
FIG. 2B

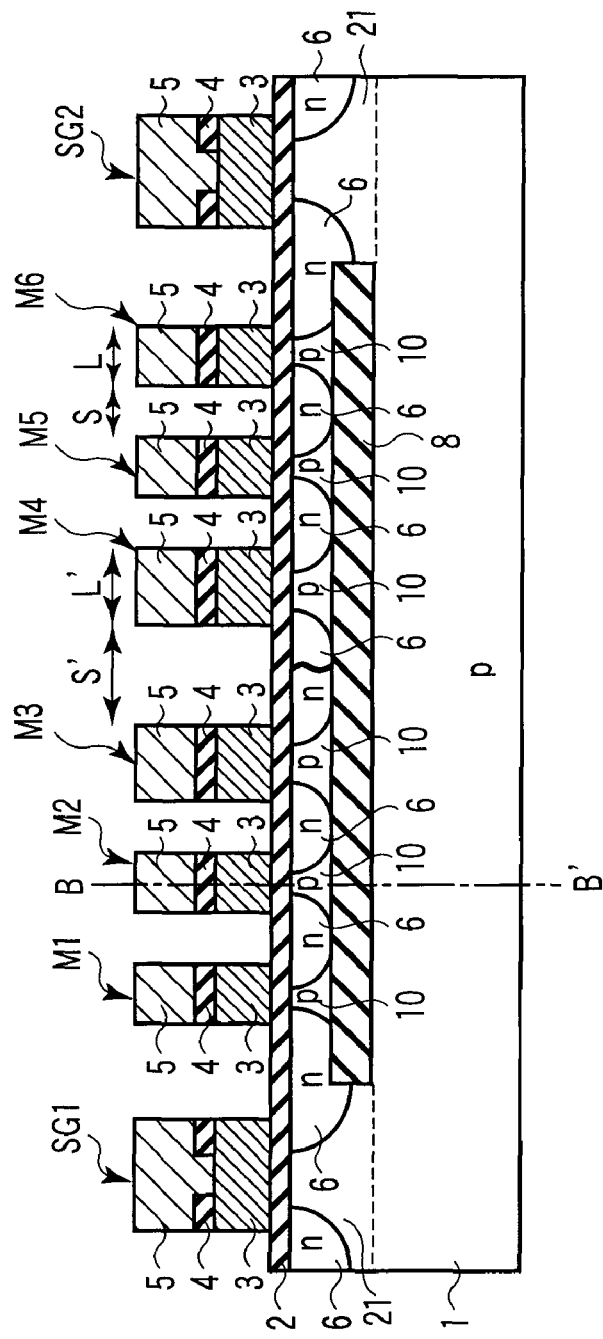
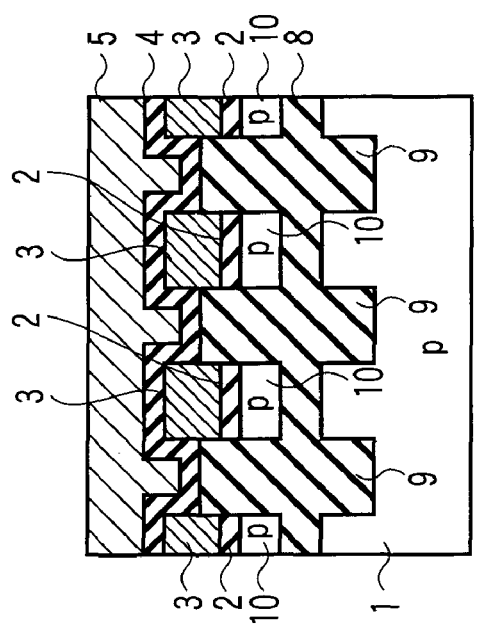
F I G. 4A
F I G. 4B

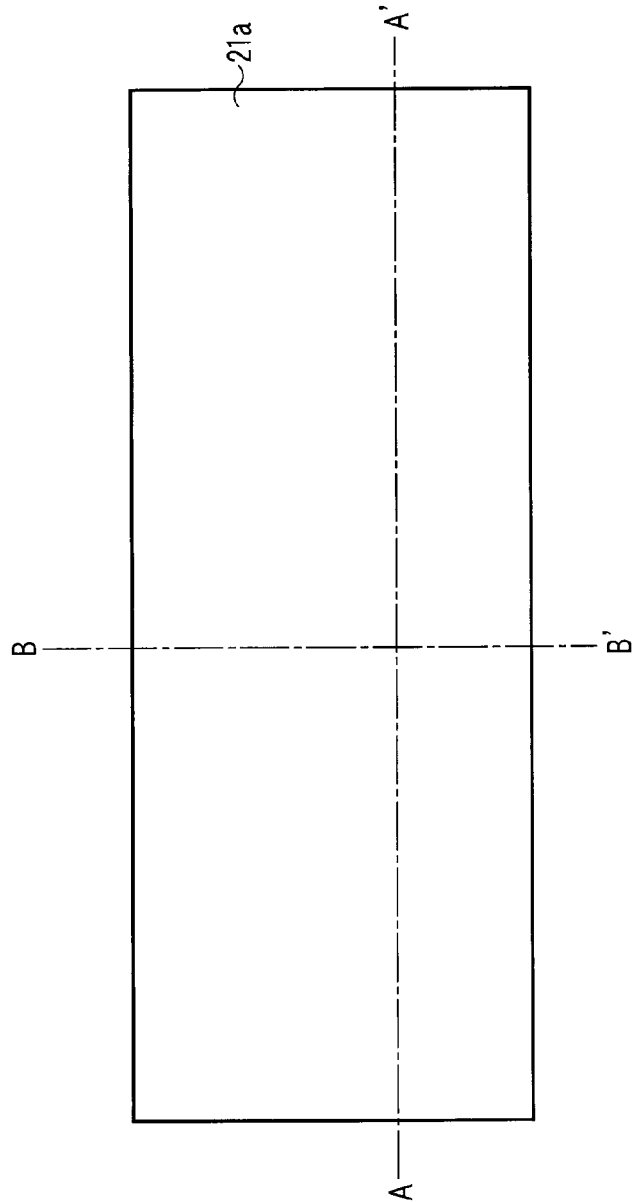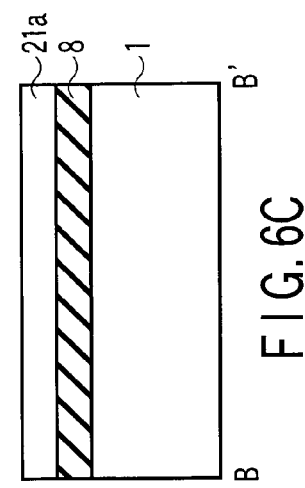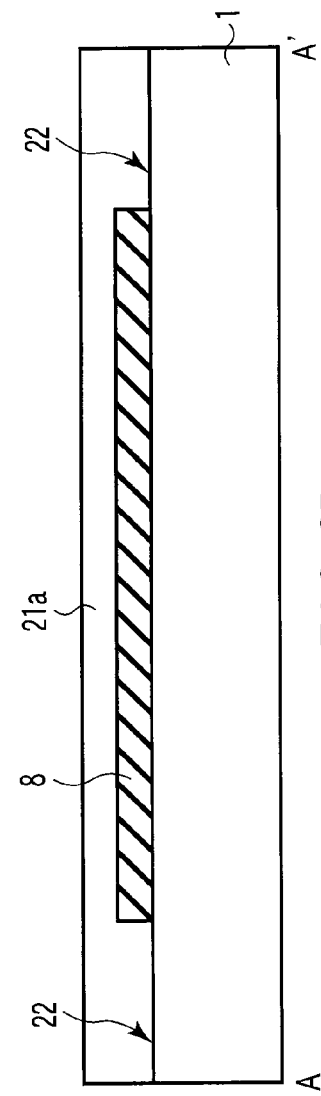

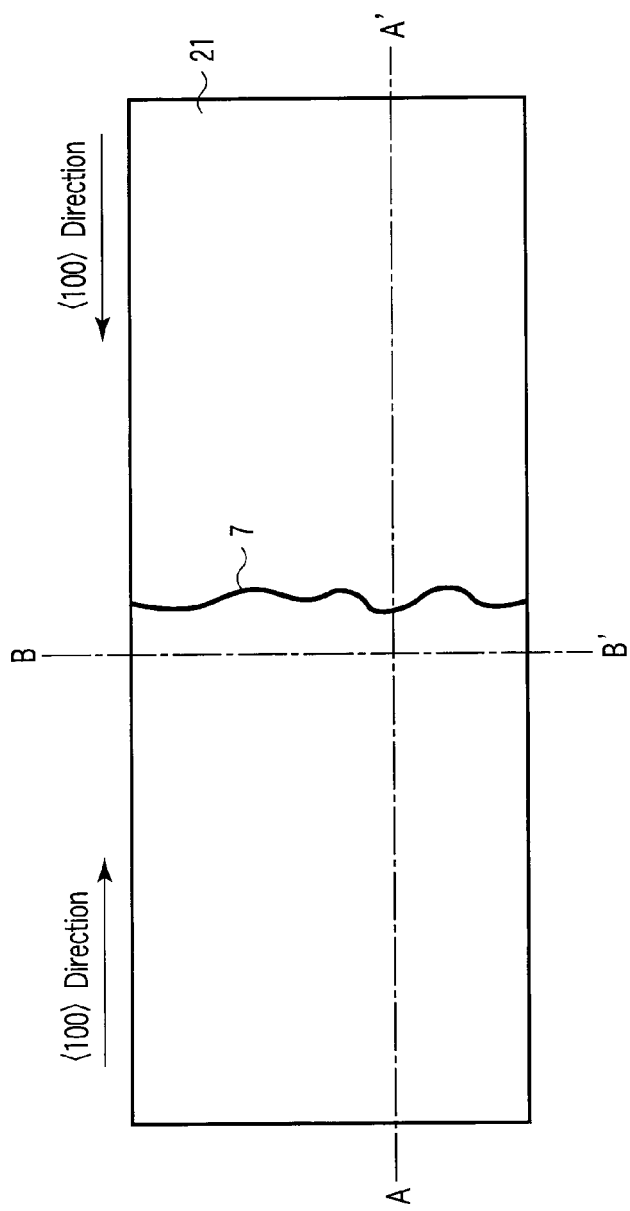
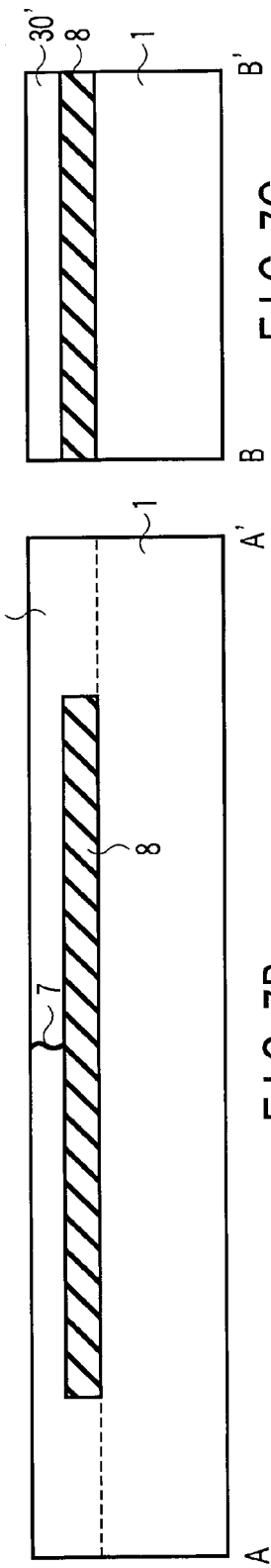
FIG. 7A
FIG. 7B
FIG. 7C

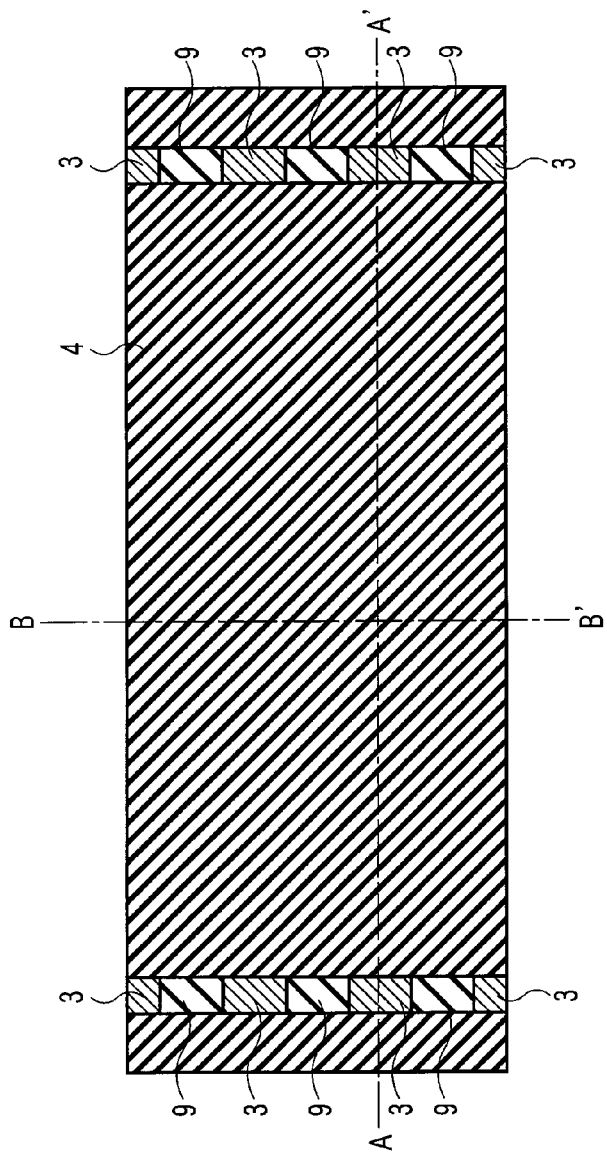
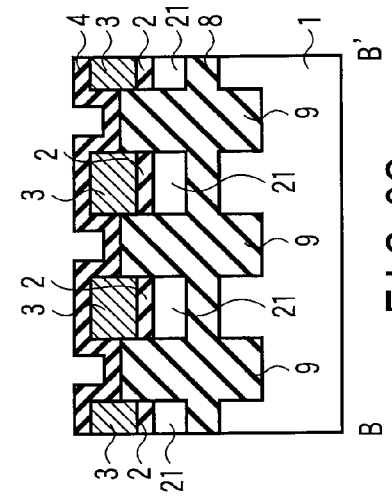
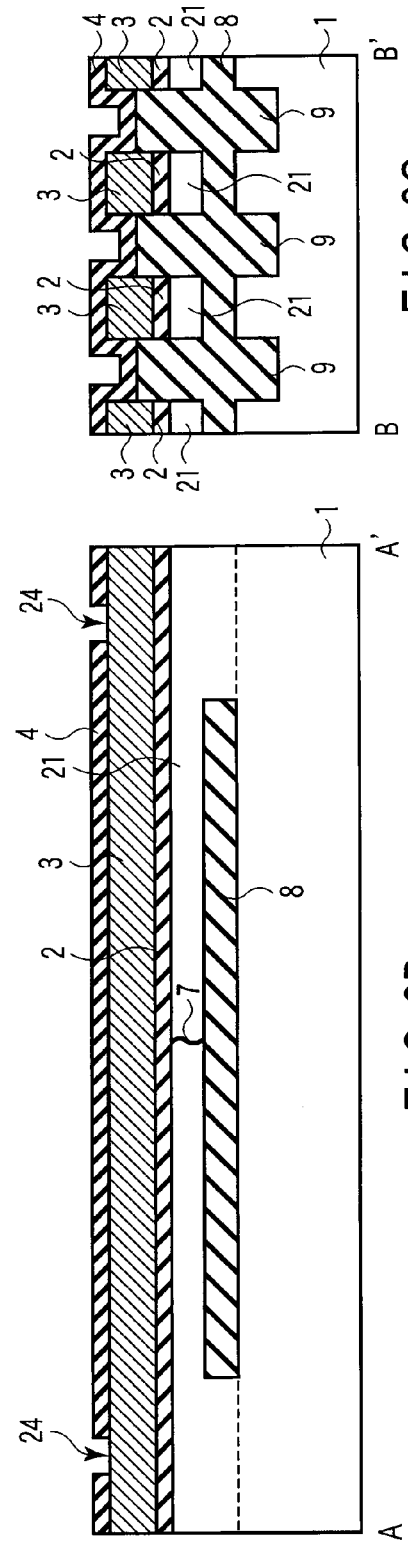

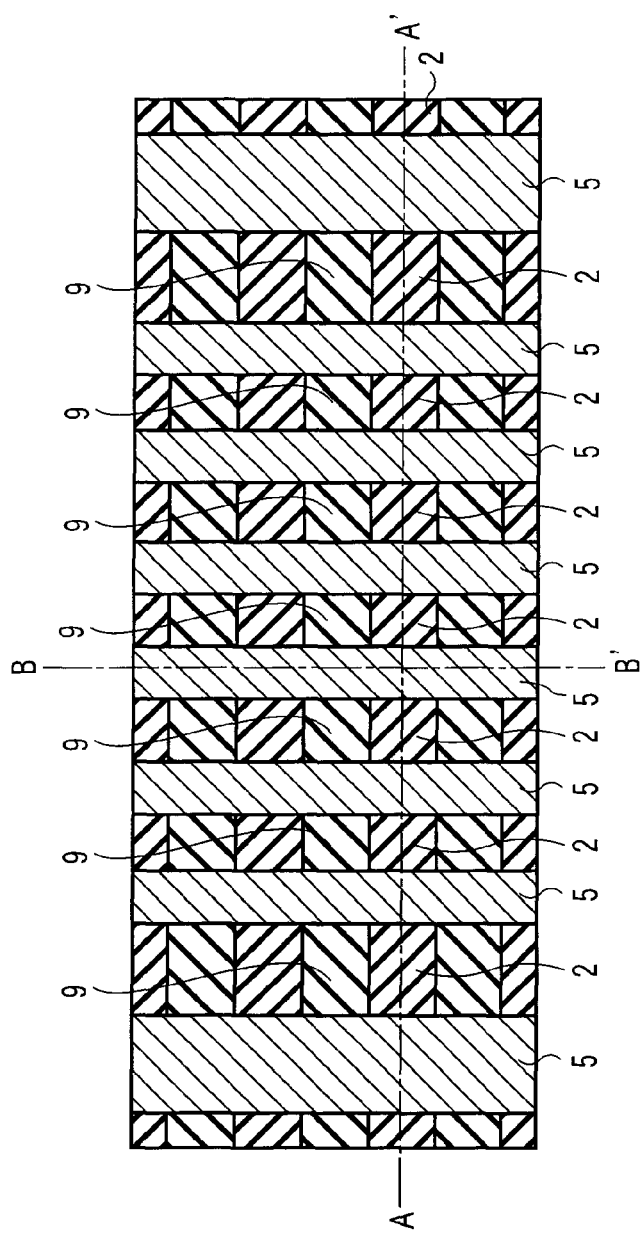
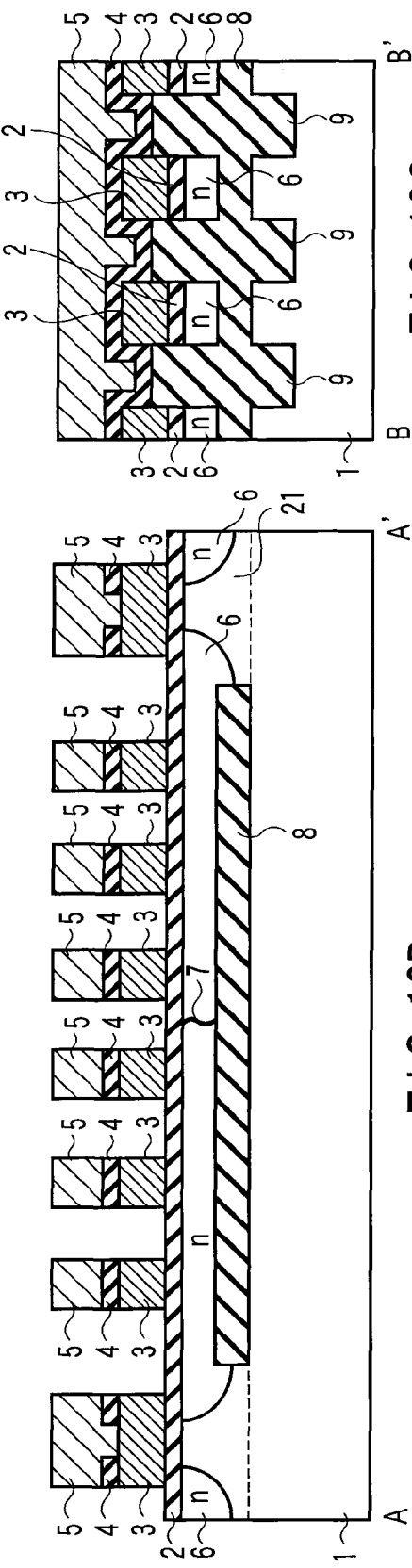
FIG. 10A
FIG. 10B
FIG. 10C

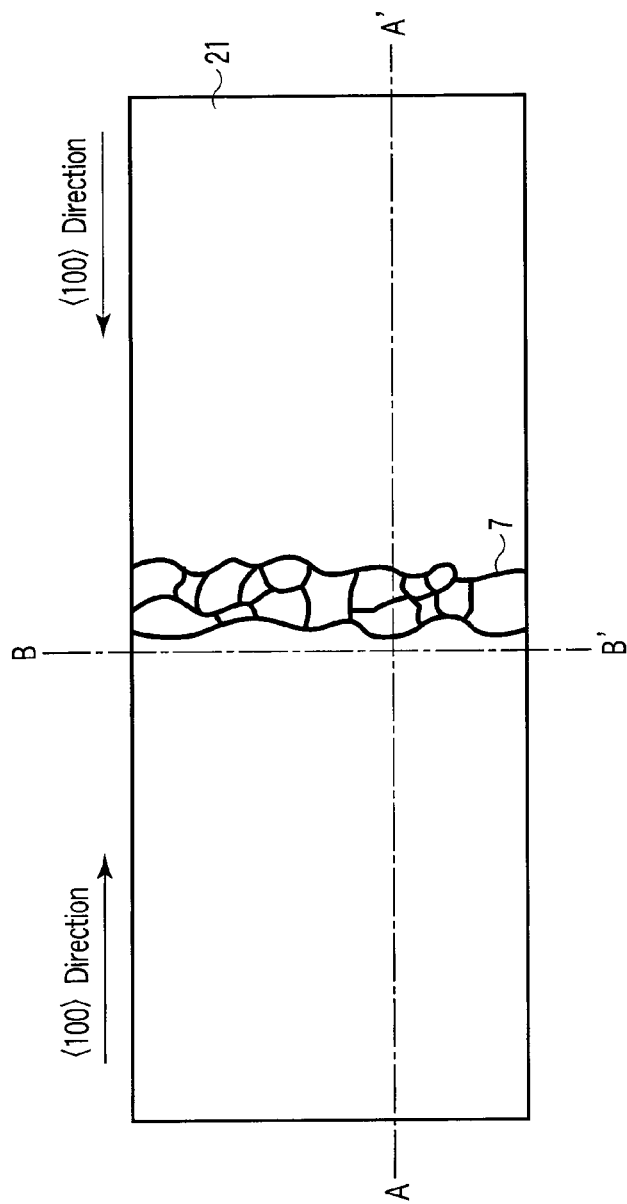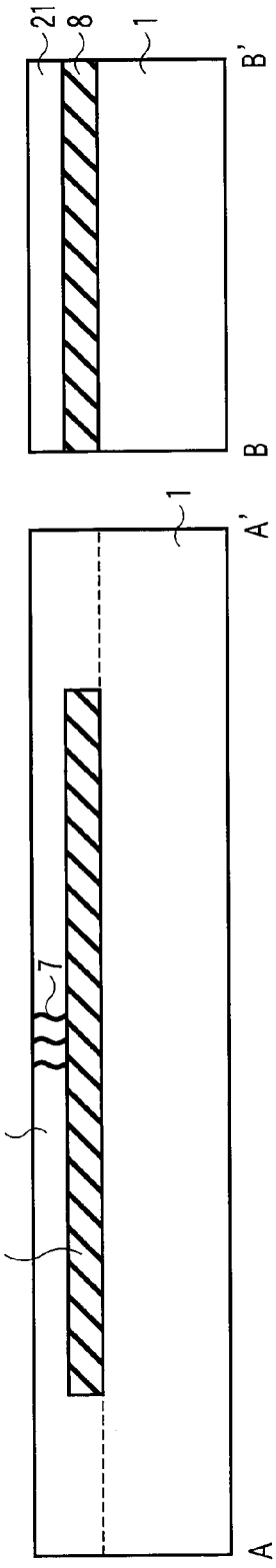
FIG. 11A
FIG. 11B
FIG. 11C

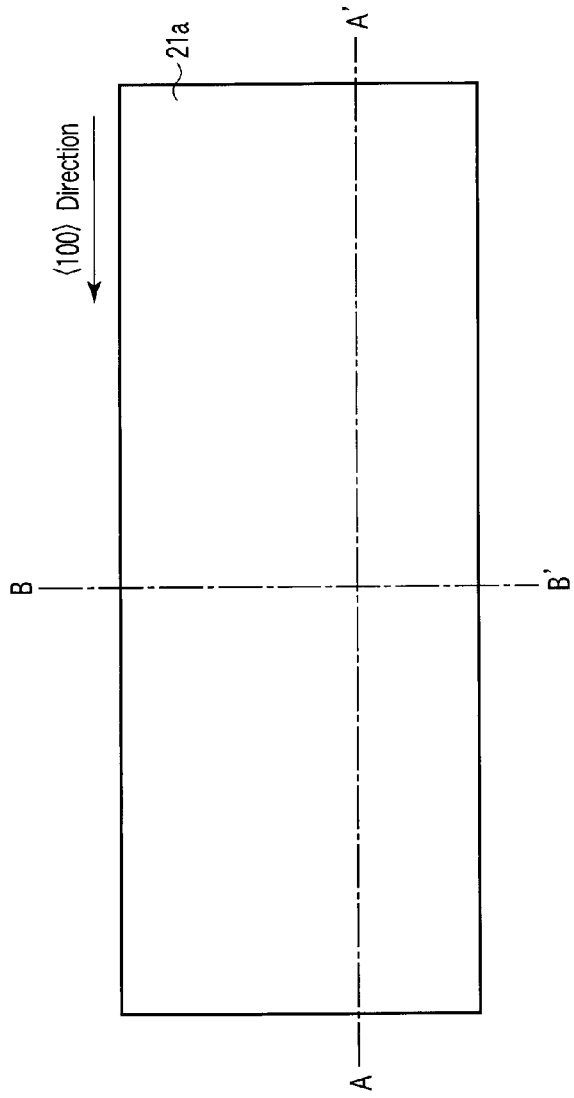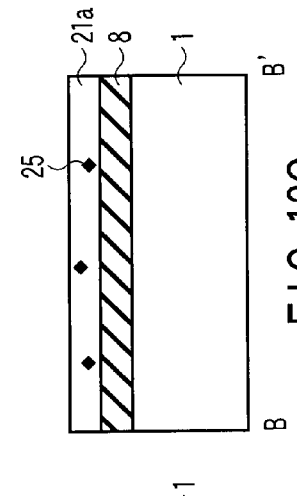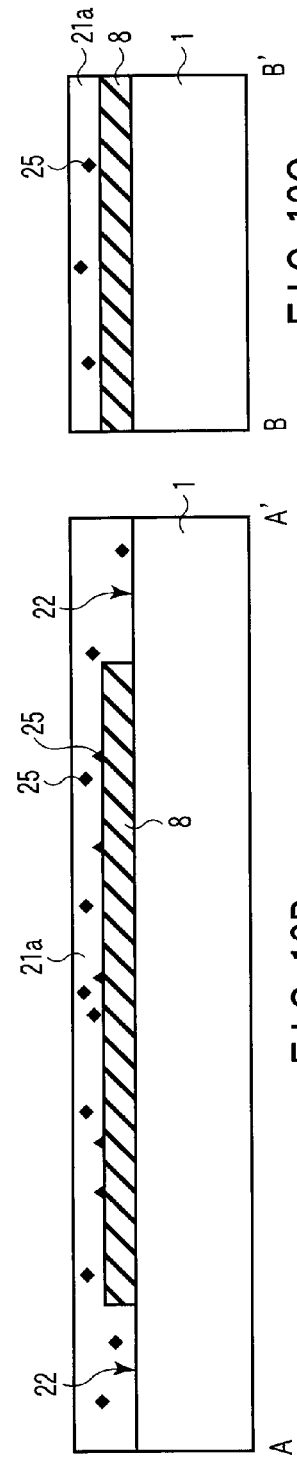

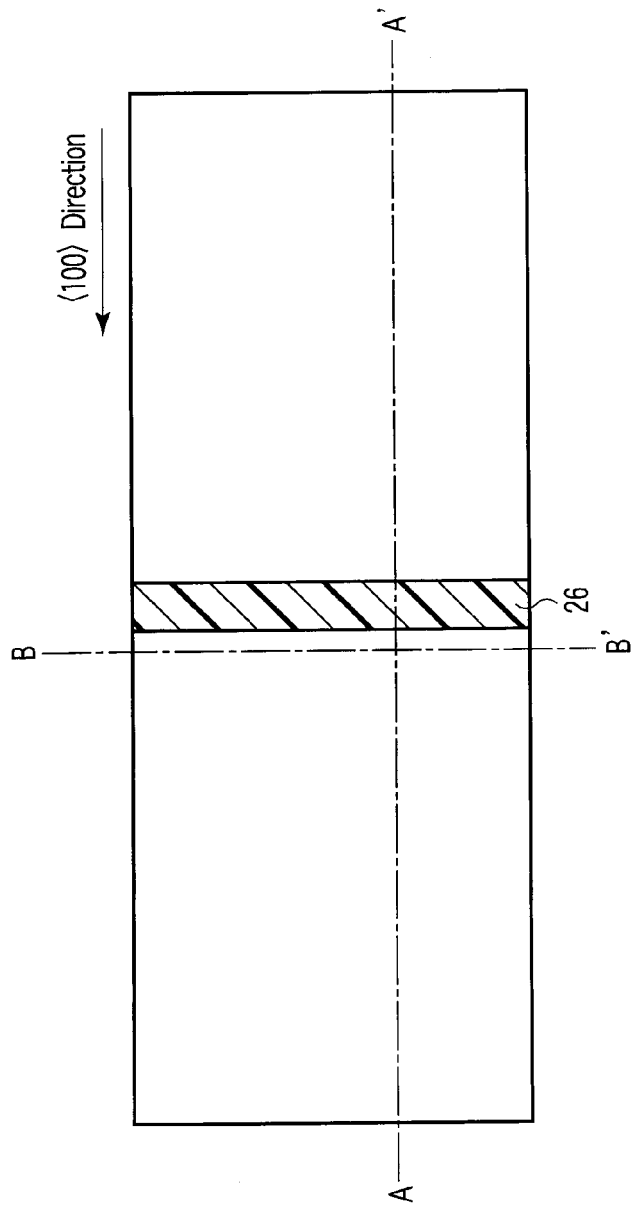
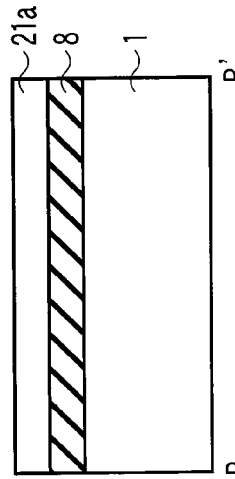
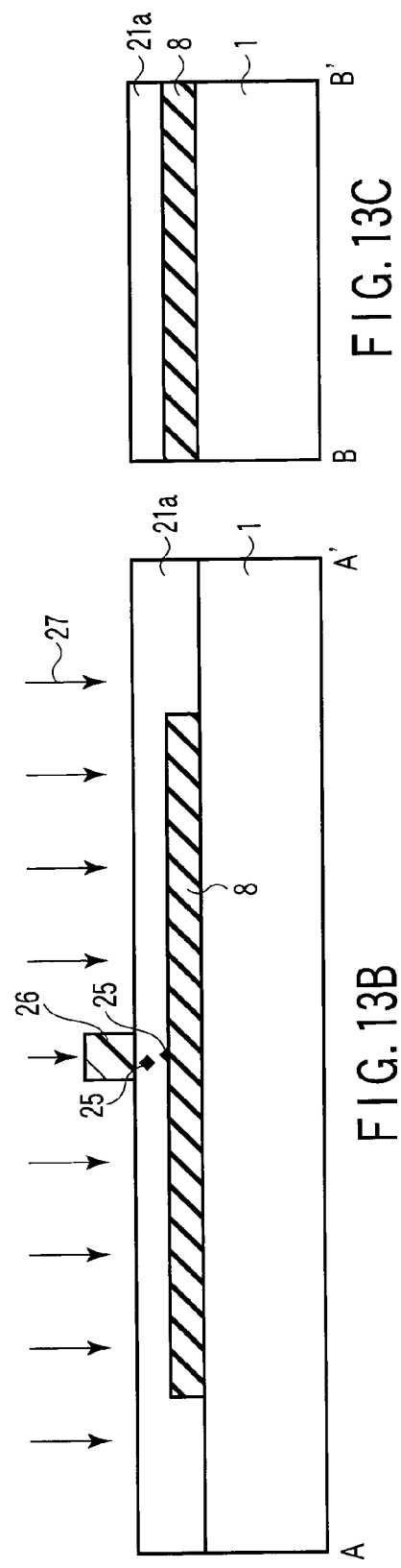
FIG. 13A
FIG. 13B
FIG. 13C

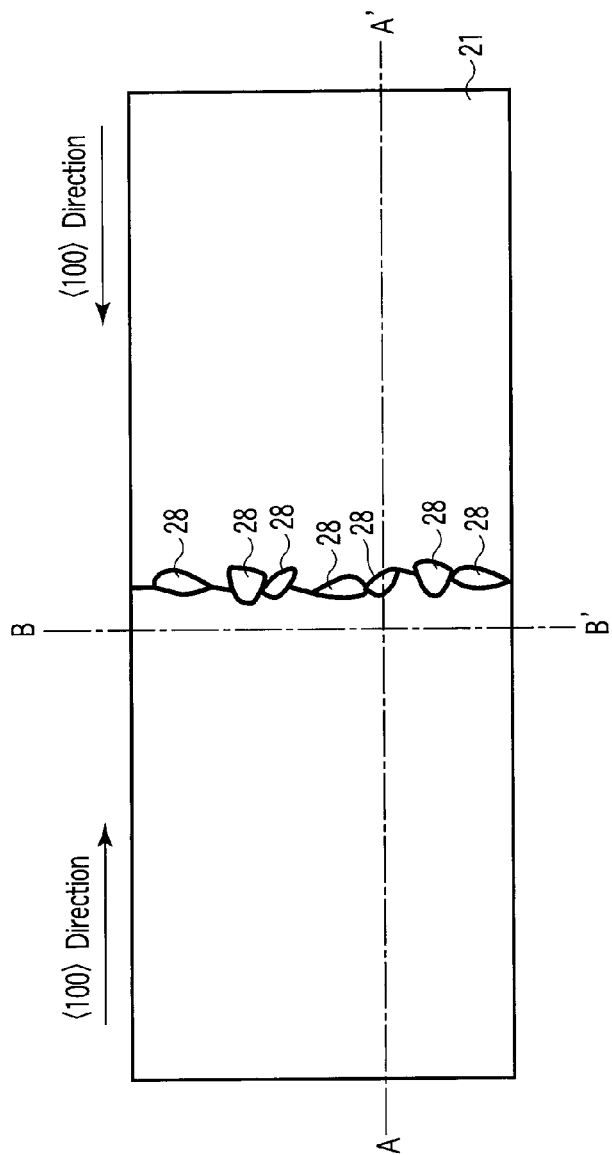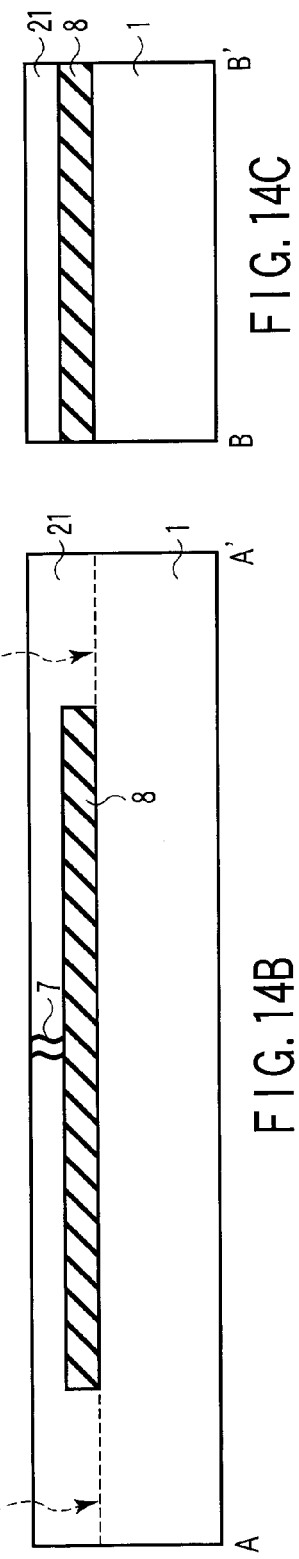

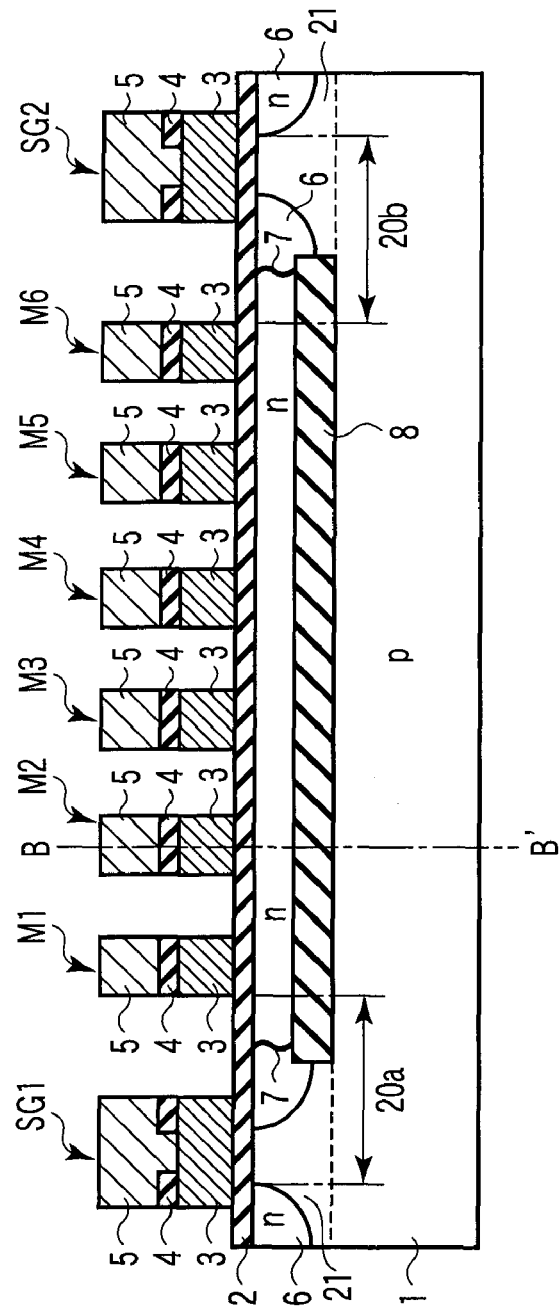
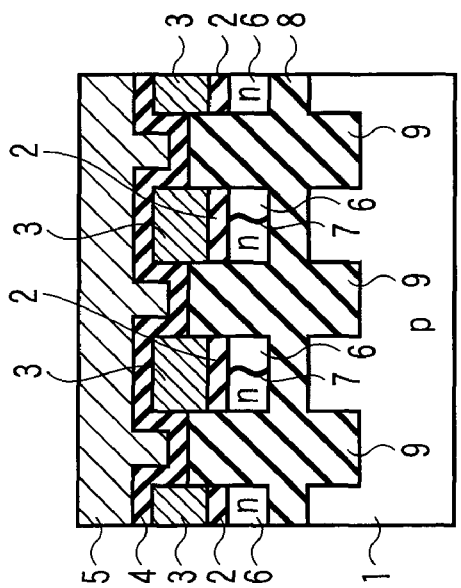
F I G. 15A
F I G. 15B

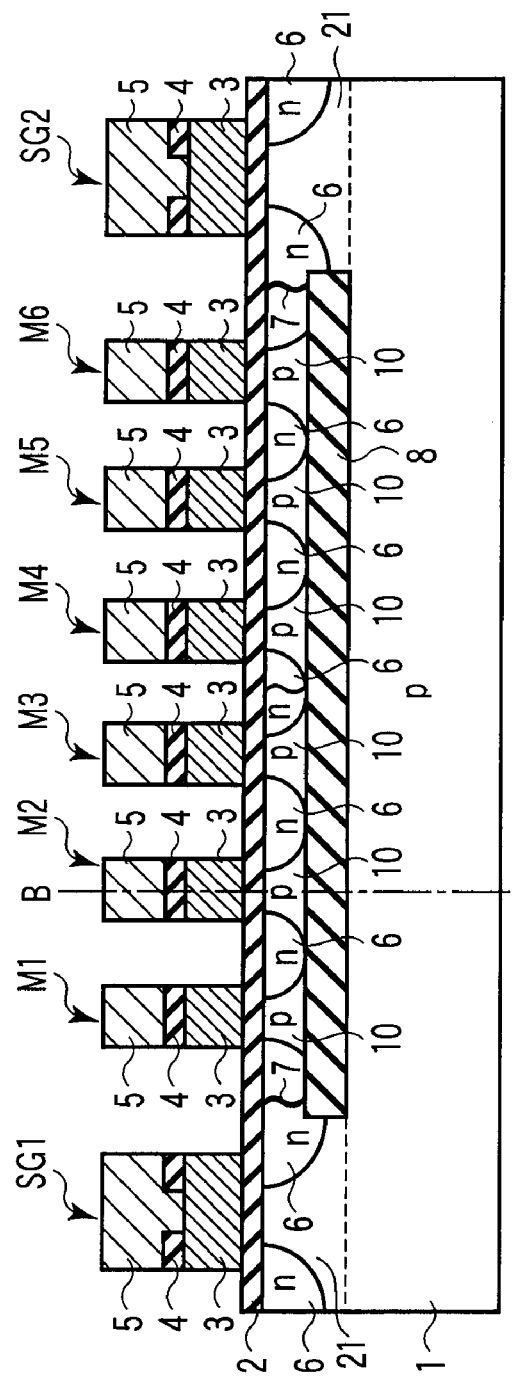
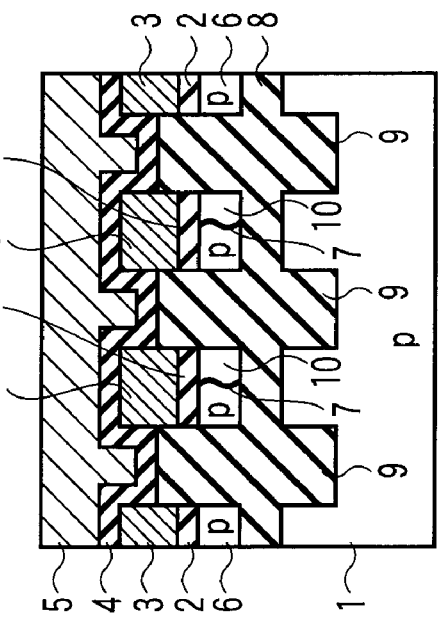
FIG. 16A
FIG. 16B

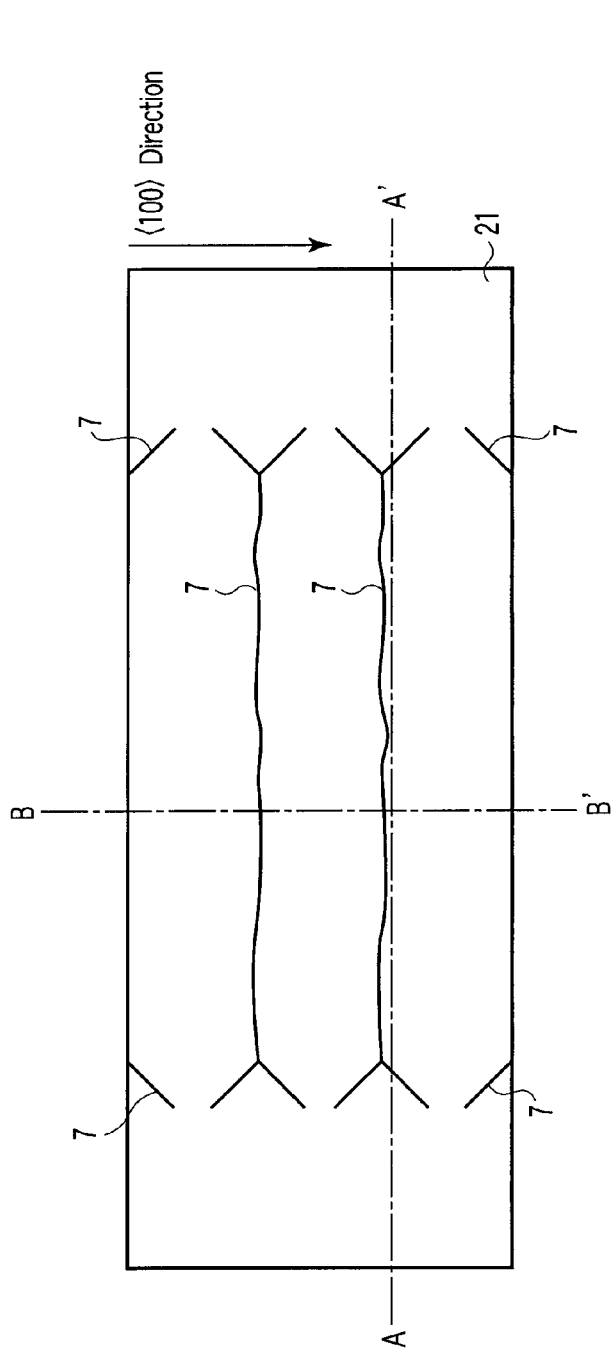
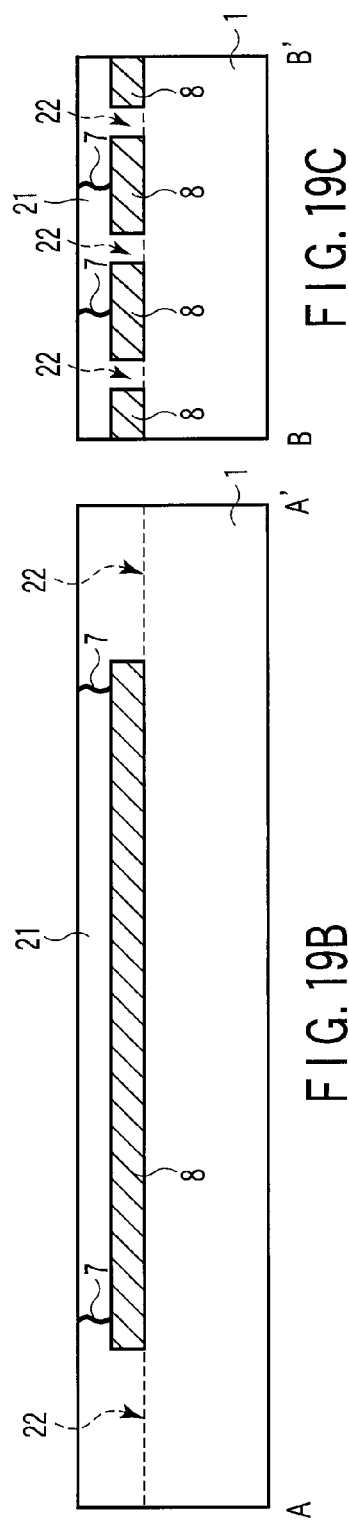
F I G. 19A
F I G. 19B
F I G. 19C

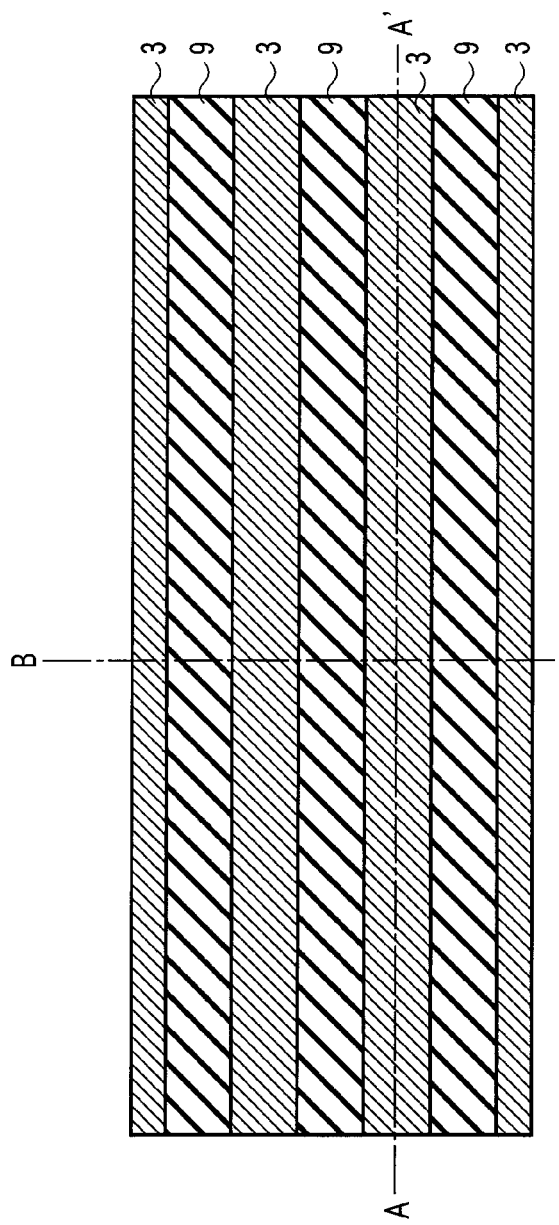
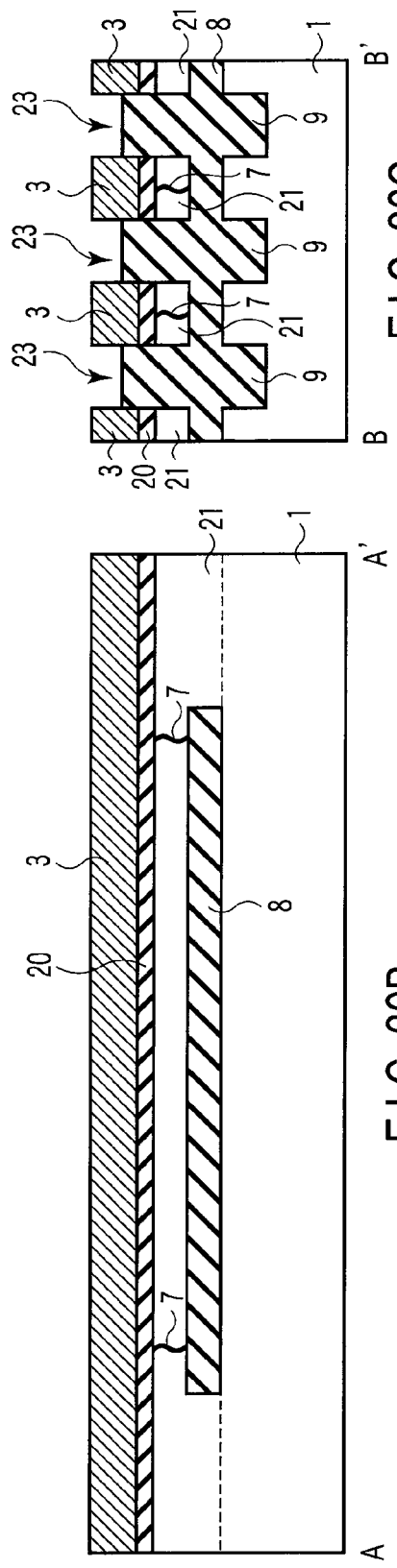
FIG. 20A
FIG. 20B
FIG. 20C

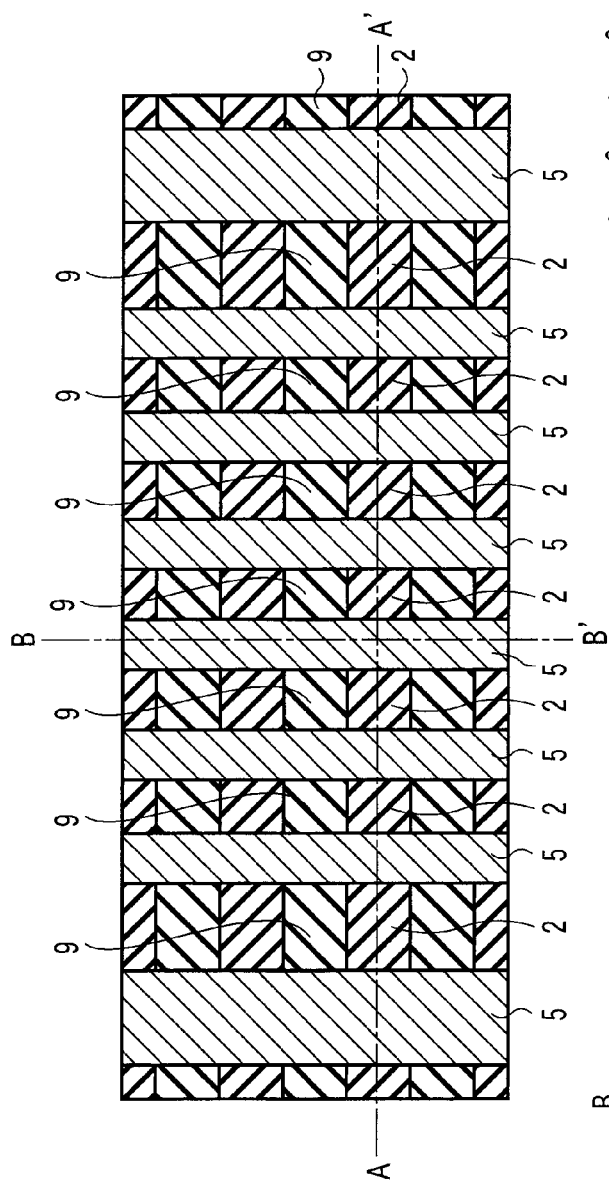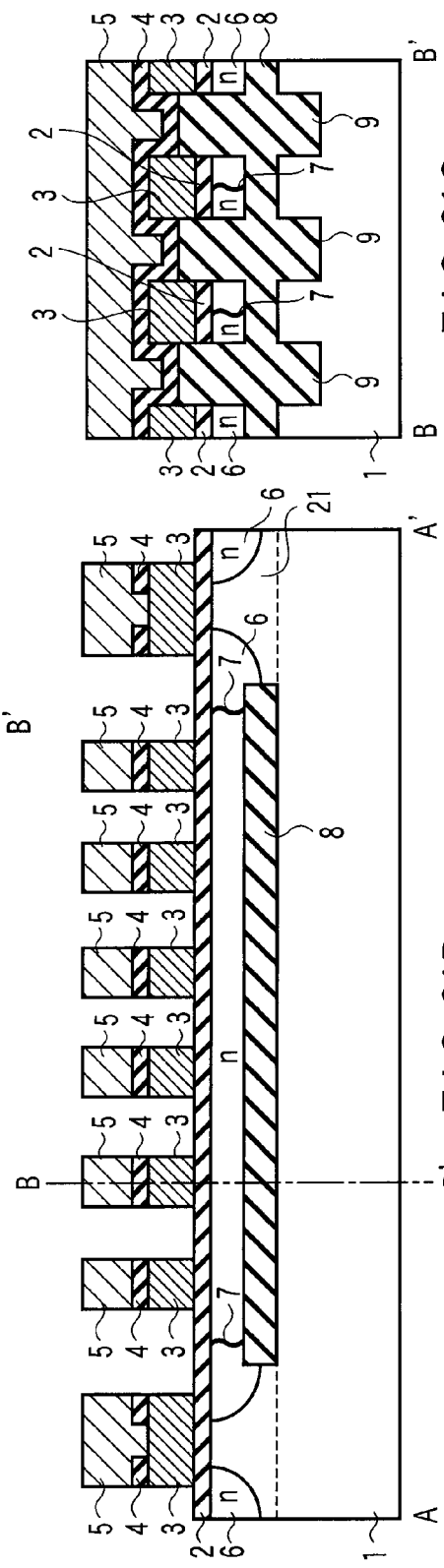
FIG. 21A
FIG. 21B
FIG. 21C

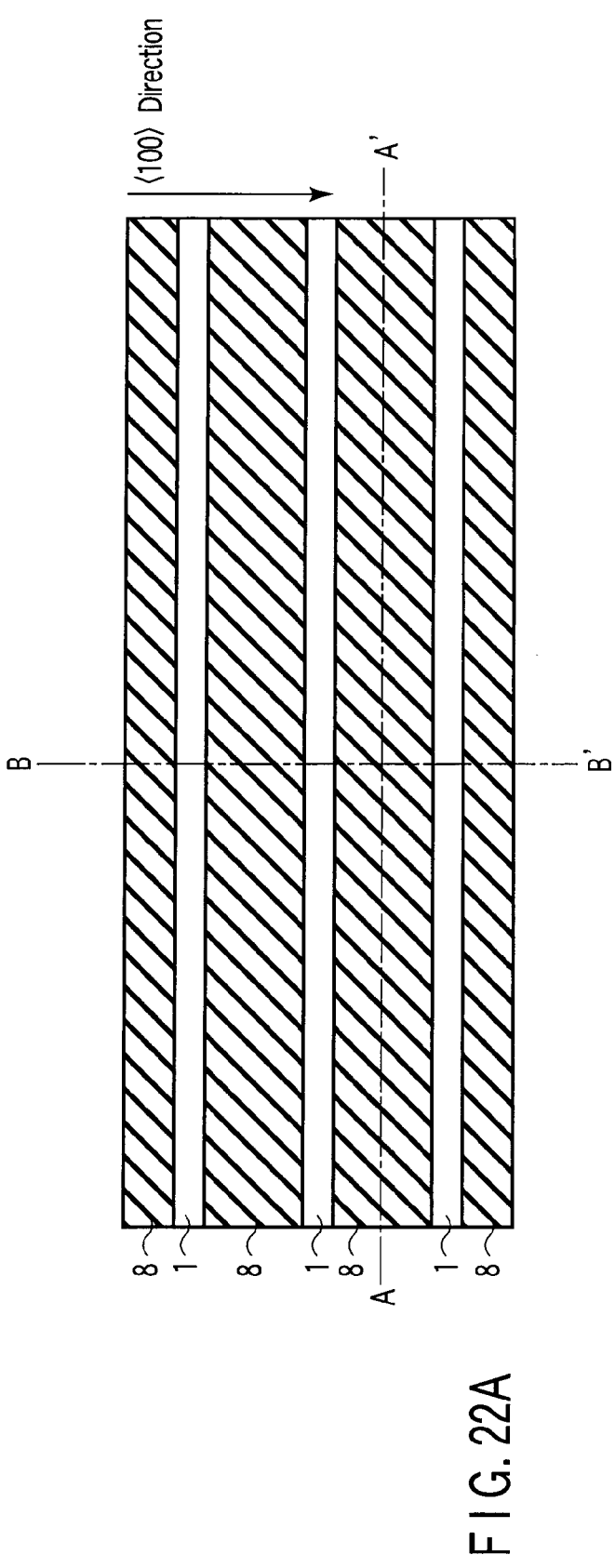
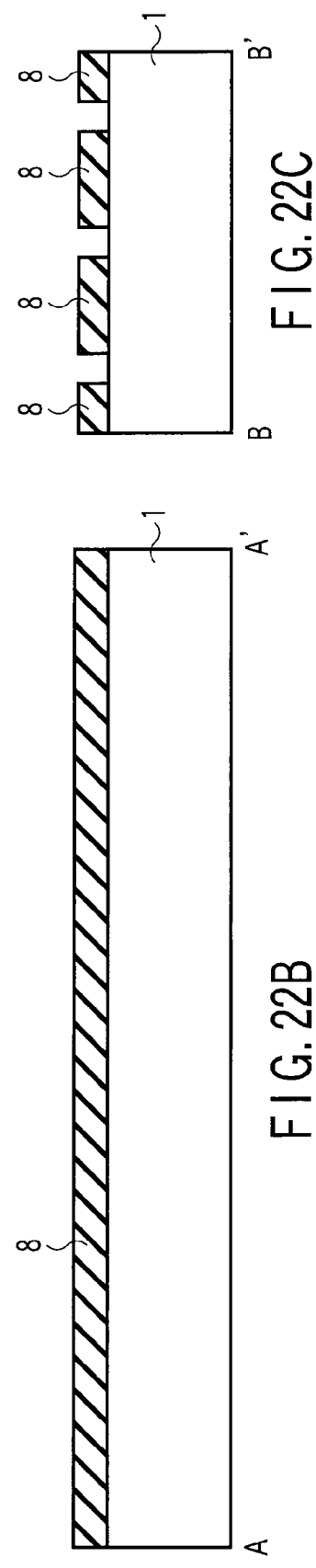
FIG. 22A
FIG. 22B
FIG. 22C

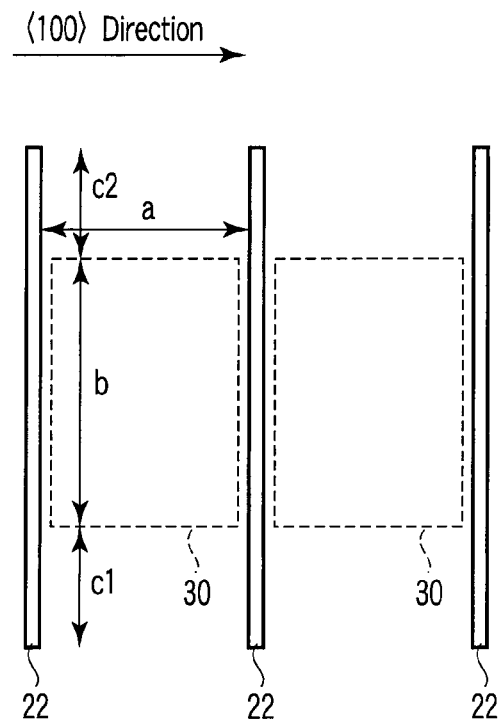
F I G. 23
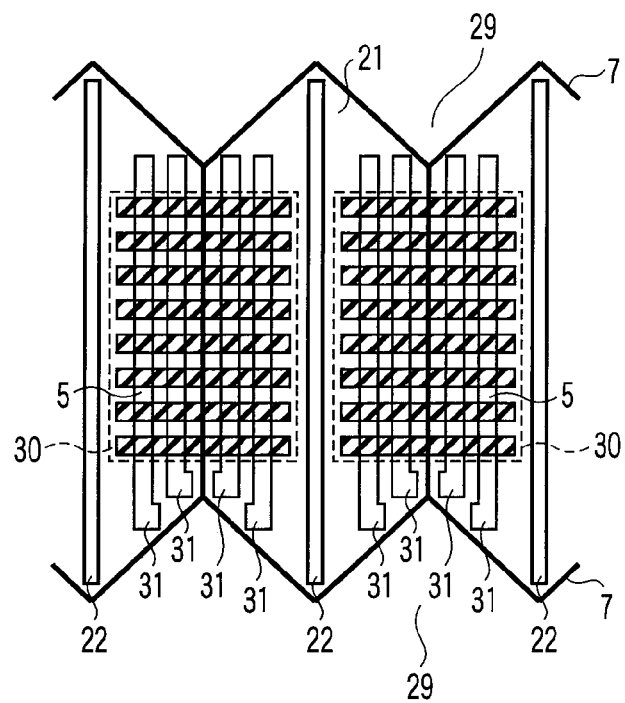
F I G. 24

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2007-051792, filed Mar. 1, 2007, the entire contents of which are incorporated herein by reference.

BACKGROUND OF THE INVENTION

1. Field of the Invention

The present invention relates to a semiconductor device comprising a plurality of nonvolatile memory cell transistors and a method for manufacturing the same.

2. Description of the Related Art

FIGS. 27A and 27B show cross-sectional views of the conventional nonvolatile semiconductor memory device. FIG. 27A is the cross-sectional view in a channel length direction (bit line direction), while FIG. 27B is the cross-sectional view in a channel width direction (word line direction). FIG. 27B is the cross-sectional view of the nonvolatile semiconductor memory device in a surface orthogonal to the drawing and taken along a line B-B' in FIG. 27A.

An active area surrounded by an isolation insulating film 92 is provided on the surface of a semiconductor substrate 91. A plurality of impurity diffusion layers 93 are provided in the active area so as to be isolated with each other. A plurality of memory cell transistors M1 to M4, which have a two-layer gate structure constituted of a tunnel insulation film 94, a floating gate electrode 95, an inter-electrode insulation film 96 and a control gate electrode 97, are arranged and provided between adjacent impurity diffusion layers 93.

In addition, a select gate transistor SG, which has a stacked gate electrode structure with a floating gate electrode 95a and a control gate electrode 97a electrically connected, is provided in the both sides (only one side is shown in FIG. 27A) of the plurality of memory cell transistors.

Further, the entire memory cell transistors are covered with an interlayer insulation film 98, a buried layer (plug) 99 to a bit line contact BL (and a source line contact SL) is electrically connected to the impurity diffusion layer 93 provided outside of the select gate transistor SG.

In the constitution of a memory cell array portion in the conventional nonvolatile semiconductor memory device, there is a limit to miniaturize the size of the memory cell transistor. Typically, when the channel length of the memory cell transistor is set to 50 nm or less, an on/off ratio of channel current is lowered due to the so-called short channel effect to cause malfunction of the memory cell transistor.

As a countermeasure for the memory malfunction, Jpn. Pat. Appln. KOKAI Publication No. 2002-289810 proposes the formation of the memory cell array portion on an SOI layer. However, even if such a memory cell array portion is adopted, not all problems of the memory malfunction are solved. That is, the problem of erase malfunction remains unresolved in the prior art.

BRIEF SUMMARY OF THE INVENTION

According to an aspect of the present invention, there is provided a semiconductor device comprising: a silicon crystal layer formed on an insulating layer, the silicon crystal layer containing a crystal lattice mismatch plane; a memory cell array portion formed on the silicon crystal layer, the memory cell array portion comprising a plurality of memory strings, each of the plurality of memory strings comprising a plurality of nonvolatile memory cell transistors connected in series in a first direction, the plurality of memory strings being arranged in a second direction orthogonal to the first direction; the crystal lattice mismatch plane crossing the silicon crystal along the second direction without passing under gates of the plurality of nonvolatile memory cell transistors as viewed from a top of the silicon crystal layer, or crossing the silicon crystal along the first direction with passing under gates of the plurality of nonvolatile memory cell transistors as viewed from the top of the silicon crystal layer.

According to an aspect of the present invention, there is provided a method for manufacturing semiconductor device comprising: setting a nonvolatile memory cell transistor formation region on a silicon crystal substrate, the nonvolatile memory cell transistor formation region having a rectangular shape of which one side directs to <100> direction; forming an insulating layer on the silicon crystal substrate; exposing a part of the silicon crystal substrate by etching the insulating layer, the exposed part of the silicon crystal substrate being a pair of regions extending to a direction orthogonal to the <100> direction so as to sandwich the nonvolatile memory cell transistor formation region; depositing a silicon layer on a region including the exposed part of the silicon crystal substrate and the insulating layer; converting the silicon layer into a silicon crystal layer by solid phase epitaxy using the exposed part of the silicon crystal substrate as a seed portion; and forming a memory cell array portion comprising a plurality of memory strings on the silicon crystal layer on the nonvolatile memory cell transistor formation region, each of the plurality of memory strings comprising a plurality of nonvolatile memory cell transistors connected in series in the <100> direction, the plurality of memory strings being arranged in a direction orthogonal to the <100> direction.

According to another aspect of the present invention, there is provided a method for manufacturing semiconductor device comprising: setting a nonvolatile memory cell transistor formation region on a silicon crystal substrate, the nonvolatile memory cell transistor formation region having a rectangular shape of which one side directs to <100> direction; forming an insulating layer on the silicon crystal substrate; exposing a part of the silicon crystal substrate by etching the insulating layer, the exposed part of the silicon crystal substrate being a region surrounding outside of the nonvolatile memory cell transistor formation region and having a rectangular shape with a side extending to a direction orthogonal to the <100> direction; depositing a silicon layer on a region including the exposed part of the silicon crystal substrate and the insulating layer; converting the silicon layer into a silicon crystal layer by solid phase epitaxy using the exposed part of the silicon crystal substrate as a seed portion; and forming a memory cell array portion comprising a plurality of memory strings on the silicon crystal layer on the nonvolatile memory cell transistor formation region, each of the plurality of memory strings comprising a plurality of nonvolatile memory cell transistors connected in series in the <100> direction, the plurality of memory strings being arranged in a direction orthogonal to the <100> direction.

BRIEF DESCRIPTION OF THE SEVERAL VIEWS OF THE DRAWING

FIGS. 2A and 2B are cross-sectional views showing a modification of the semiconductor device in FIGS. 1A and 1B;

FIGS. 4A and 4B are cross-sectional views showing still another modification of the semiconductor device in FIGS. 1A and 2B;

FIGS. 6A to 6C are a plan view and cross-sectional views for explaining the method for manufacturing the semiconductor device of the first embodiment following FIGS. 5A to 5C;

FIGS. 7A to 7C are a plan view and cross-sectional views for explaining the method for manufacturing the semiconductor device of the first embodiment following FIGS. 6A to 6C;

FIGS. 9A to 9C are a plan view and cross-sectional views for explaining the method for manufacturing the semiconductor device of the first embodiment following FIGS. 8A to 8C;

FIGS. 10A to 10C are a plan view and cross-sectional views for explaining the method for manufacturing the semiconductor device of the first embodiment following FIGS. 9A to 9C;

FIGS. 11A to 11C are a plan view and cross-sectional views for explaining the method for the formation of a silicon crystal layer (SOI crystal layer) having a plurality of crystal lattice mismatch planes;

FIGS. 12A to 12C are a plan view and cross-sectional views for explaining a method for manufacturing a semiconductor device of a second embodiment;

FIGS. 13A to 13C are a plan view and cross-sectional views for explaining the method for manufacturing the semiconductor device of the second embodiment following FIGS. 12A to 12C;

FIGS. 14A to 14C are a plan view and cross-sectional views for explaining the method for manufacturing the semiconductor device of the second embodiment following FIGS. 13A to 13C;

FIGS. 15A and 15B are cross-sectional views showing a semiconductor device according to a third embodiment;

FIGS. 16A and 16B are cross-sectional views showing a modification of the semiconductor device in FIGS. 15A and 15B;

FIGS. 19A to 19C are a plan view and cross-sectional views for explaining the method for manufacturing the semiconductor device of the third embodiment following FIGS. 18A to 18C;

FIGS. 20A to 20C are a plan view and cross-sectional views for explaining the method for manufacturing the semiconductor device of the third embodiment following FIGS. 19A to 19C;

FIGS. 21A to 21C are a plan view and cross-sectional views for explaining the method for manufacturing the semiconductor device of the third embodiment following FIGS. 20A to 20C;

FIGS. 22A to 22C are a plan view and cross-sectional views for explaining a method for avoiding the formation of the crystal lattice mismatch plane between a select gate transistor and a memory cell transistor;

FIG. 23 is a plan view for explaining a method for manufacturing a semiconductor device of a fourth embodiment;

FIG. 24 is a plan view for explaining the method for manufacturing the semiconductor device of the fourth embodiment following FIG. 23;

DETAILED DESCRIPTION OF THE INVENTION

Figure 1A:
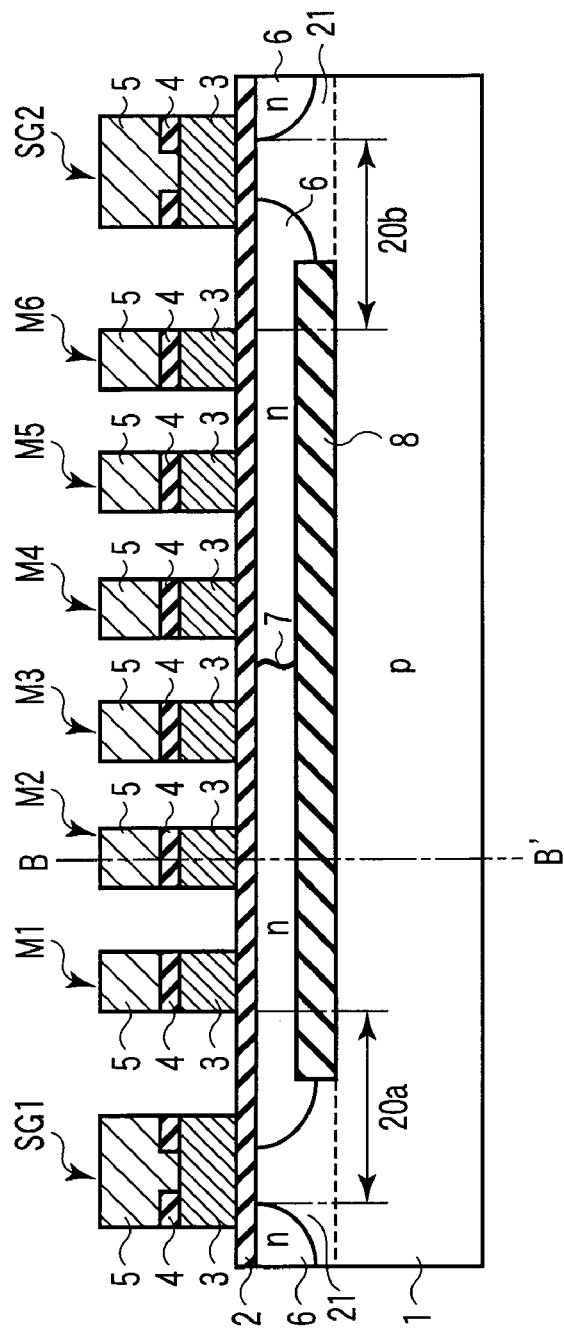
FIGS. 1A and 1B are cross-sectional views showing a semiconductor device according to a first embodiment.

Hereinafter, the embodiments of the present invention are described by referring to the drawings.

First Embodiment

Figure 1B:
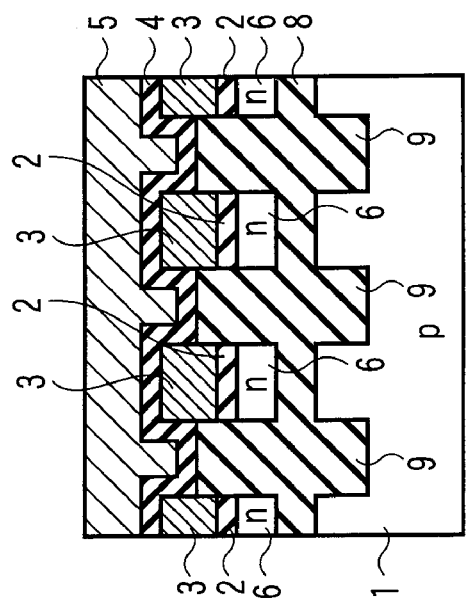

FIGS. 1A and 1B are cross-sectional views showing a semiconductor device according to the first embodiment, and specifically are cross-sectional views showing a memory cell array portion constituting a nonvolatile memory in the semiconductor device. In the present embodiment, the nonvolatile memory is a NAND-type flash memory. The semiconductor device is specifically the nonvolatile memory itself, or an electronic device such as a music reproduction device comprising the nonvolatile memory.

FIG. 1A is the cross-sectional view in a channel length direction (bit line direction), and FIG. 1B is the cross-sectional view in a channel width direction (word line direction). Here, FIG. 1B is the cross-sectional view in a surface orthogonal to the drawing and taken along a line B-B' in FIG. 1A.

The semiconductor device of the present embodiment comprises a silicon crystal layer 21 formed on a buried insulator (insulating layer) 8 containing a crystal lattice mismatch plane 7, and a memory cell array portion. The memory cell array portion comprises a plurality of NAND strings. Each of the NAND strings comprises a plurality of nonvolatile memory cell transistors M1 to M6 connected in series in the bit line direction (a first direction). In addition, the plurality of NAND strings are arranged in the word line direction (a second direction) orthogonal to the bit line direction.

The crystal lattice mismatch plane 7 is penetrated through the silicon crystal layer 21 in the film thickness direction of the silicon crystal layer 21 on the cross-sectional surface in the channel length direction of the nonvolatile memory cell transistor. As viewed from the top of the silicon crystal layer 21 (FIGS. 7A to 7C), the crystal lattice mismatch plane 7 is formed to cross the silicon crystal layer 21 along the word line direction with avoiding (without passing) under the gates of the plurality of nonvolatile memory cell transistors M1 to M6.

Hereinafter, the semiconductor device of the present embodiment is further described.

In the drawings, reference numeral 1 represents a p-type silicon crystal substrate, the silicon crystal substrate 1 has an isolation region formed in the bit line direction and active areas isolated by the isolation region.

On the active areas, the plurality of nonvolatile memory cell transistors M1 to M6 connected in series in the bit line direction and a pair of select gate transistors SG1 and SG2 provided on the both sides of the nonvolatile memory cell transistors (hereinafter, simply referred to as a memory cell transistor) are formed in the active area.

Although the six memory cell transistors M1 to M6 are shown in FIG. 1A, the number is not limited thereto. Generally, in many cases, sixteen (16) or thirty-two (32) memory cell transistors are provided.

The plurality of memory cell transistors M1 to M6 respectively have a structure (two-layer gate structure) in which a tunnel insulation film 2, a floating gate electrode (charge storage layer) 3, an inter-electrode insulation film (charge block insulation film) 4 and a control gate electrode 5 are stacked sequentially.

The pair of select gate transistors SG1 and SG2 has a structure (stacked gate electrode structure) in which the gate insulation film 2 and the first and second gate electrodes 3 and 5 (stacked gate electrodes) are stacked sequentially.

In the present embodiment, since the tunnel insulation film and the gate insulation film are constituted of an insulation film formed in the same step, they are allocated with the same reference numeral 2 in FIGS. 1A and 1B. Likewise, since the floating gate electrode and the first gate electrode are constituted of a conductive film formed in the same step, they are allocated with the same reference numeral 3. In a similar manner, since the control gate electrode and the second gate electrode are constituted of a conductive film formed in the same step, they are allocated with the same reference numeral 5.

A buried insulator 8 is buried in the silicon crystal substrate 1 in the formation region of the plurality of memory cell transistors M1 to M6.

Here, a semiconductor substrate portion (silicon crystal layer 21) on the buried insulator 8 is referred to as an SOI (Silicon on Insulator) layer. The SOI layer has a crystal structure, and the central portion in the bit line direction of the SOI layer (SOI crystal layer) has one or a plurality of crystal lattice mismatch planes 7 (an example is shown in FIG. 1A).

Here, the crystal lattice mismatch plane 7 is an interface formed by collision of two crystals having different crystal orientations like a crystal grain boundary, an interface of two crystals which orientations being shifted each other as twin crystals, an interface formed by collision of two crystals having different crystal lattice spacing, an interface formed by shift of a part of a crystal along its crystal lattice plane like a stacking fault, or the like.

Then, an n-type impurity diffusion layer 6 is provided in the surface portion of the silicon crystal substrate 1 except immediately under the gate electrode 3 of the select gate transistors SG1 and SG2, and the SOI crystal layer is an n-type layer. That is, the memory cell transistor of the present embodiment is a depletion type cell transistor.

According to the present embodiment, since the memory cell transistors are provided on the SOI crystal layer, the short channel effect less likely occurs. Therefore, it is possible to avoid the memory malfunction occurring with the short channel effect even when the cell size is miniaturized.

In the present embodiment, the edge portion position of the buried insulator 8 is set within a region 20a and a region 20b shown in FIG. 1A. Thereby, all the memory cell transistor M1 to M6 are provided on the SOI crystal layer, and all the channel regions of the select gate transistors SG1 and SG2 are electrically connected to the silicon crystal substrate 1, so that it is possible to effectively avoid the memory malfunction.

In addition, according to the present embodiment, it is also possible to avoid the memory malfunction occurring with the electrical potential fluctuation of the SOI crystal layer at the time of erasing operation of the memory cell. That is, the memory cell erasing operation is carried out by applying a high electric field between the floating gate electrode 3 and the SOI crystal layer to transfer electric charge (electron in the present embodiment) accumulated in the floating gate electrode 3 to the SOI crystal layer (or this operation is carried out by transferring hole from the SOI crystal layer to the floating gate electrode 3). At this time, if the electric charge is accumulated in the SOI crystal layer to cause excessive fluctuation of the electrical potential of the SOI crystal layer, the erase malfunction may occur.

With respect to this problem, in the present embodiment, since the crystal lattice mismatch plane 7 provided in the SOI crystal layer functions as a carrier recombination center, the electric charge in the SOI crystal layer rapidly disappears without being accumulated therein. Particularly, as the dangling bond density in the crystal lattice mismatch plane 7 is higher, the effect as the carrier recombination center becomes larger.

Therefore, according to the present embodiment, it is possible to avoid the memory malfunction occurring with the electrical potential fluctuation of the SOI crystal layer in the memory cell erasing operation. When the crystal lattice mismatch plane 7 is provided at a plurality of positions in the SOI crystal layer, it is possible to effectively eliminate the electric charge in the SOI crystal layer, whereby the memory malfunction can be more effectively avoided.

When the crystal lattice mismatch plane 7 is present in the channel region between the pair of select gate transistors SG1 and SG2, it becomes a carrier scattering source, whereby carrier mobility may be lowered. Thus, when the high-speed operation of the transistor is desired to be realized, it is desirable that the crystal lattice mismatch plane 7 is localized. In this case, the crystal lattice mismatch plane 7 is localized at a position near the center of the SOI crystal layer in the bit line direction, that is, at the central portion of the SOI crystal layer in the bit line direction (the central portion of the plurality of nonvolatile memory cells which constitute the memory cell array portion and are connected in series in the first direction) whereby it is possible to most effectively perform the electric charge elimination in the entire SOI crystal layer.

Further, the number of the crystal lattice mismatch plane 7 may be one or a plurality (one in the drawings). When one crystal lattice mismatch plane 7 is provided, the memory malfunction can be avoided with a minimum of lowering the transistor operation speed. When the plurality of crystal lattice mismatch planes 7 are provided, it is possible to effectively perform the electric charge elimination in the SOI crystal layer.

In addition, in the present embodiment, the entire SOI crystal layer is a single conductivity type (n-type in the present embodiment). Therefore, since the crystal lattice mismatch plane 7 does not cross a pn composition surface, it is possible to avoid the memory malfunction due to transistor property fluctuation caused by junction leak.

Needless to say, when the crystal lattice mismatch plane 7 is located near the center of the SOI crystal layer in the bit line direction, at least a region near the center may be a single conductivity type.

A modification of the present embodiment is shown in FIGS. 2A and 2B. FIGS. 2A and 2B are cross-sectional views each corresponding to FIGS. 1A and 1B. In this modification, the region under the gates of the respective memory cell transistors is the p-type impurity diffusion layer 9, the interval region of the adjacent memory cell transistors is the n-type impurity diffusion layer 6. That is, the memory cell transistor of this modification is a cell transistor having a pair of source/drain region. In this case, it is desirable to control the position of the crystal lattice mismatch plane 7 so that the crystal lattice mismatch plane 7 does not cross the pn junction.

In addition, the crystal lattice mismatch plane 7 in the SOI crystal layer is preferably provided in a region except a lower region of the floating gate electrode 3 of the memory cell transistor. When the tunnel insulation film 2 is formed on the crystal lattice mismatch plane 7, the thickness of the tunnel insulation film 2 may be locally thinner, or a micro concavoconvex shape may be formed on the surface of the SOI crystal layer. As a result, the writing/erasing properties of the memory cell transistor formed on the crystal lattice mismatch plane 7 are varied. Such a property fluctuation causes the memory malfunction.

Figure 3A:
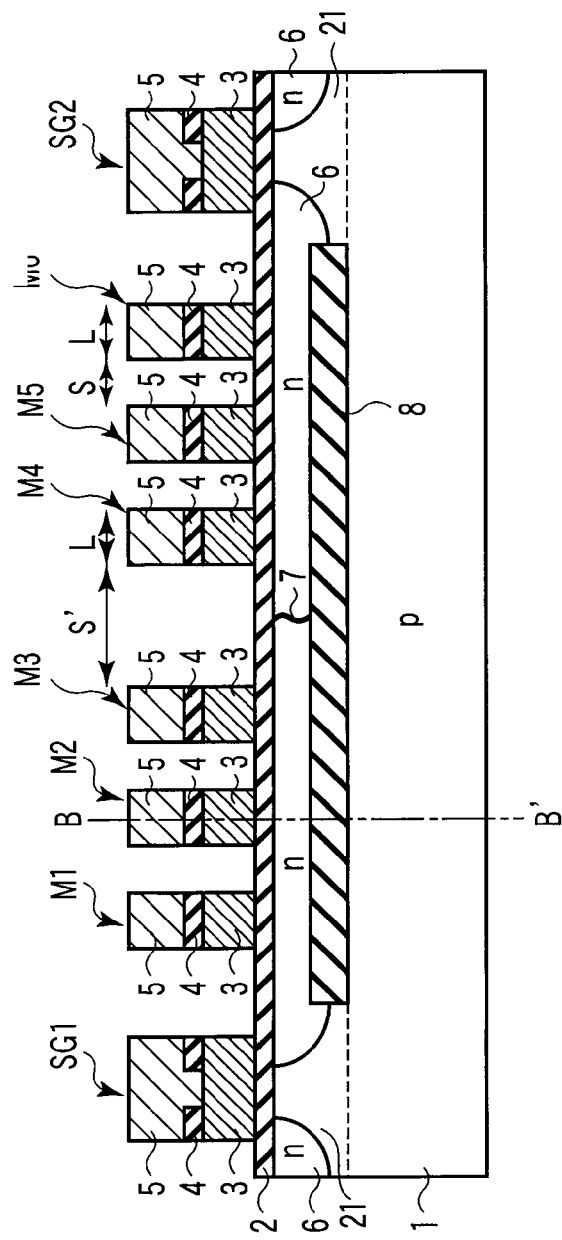
FIGS. 3A and 3B are cross-sectional views showing another modification of the semiconductor device in FIGS. 1A and 1B.
Figure 3B:
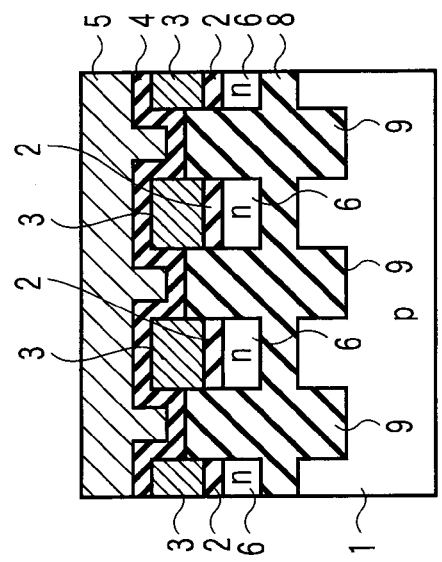

Another modification of the present embodiment capable of avoiding the above memory malfunction is shown in FIGS. 3A and 3B.

This modification adopts a structure, in which intervals S and S' between the adjacent memory cell transistors are adjusted, in order to prevent the crystal lattice mismatch plane 7 from being formed in the lower region of the flowing gate electrode 3 of the memory cell transistor.

That is, the interval S' between adjacent two memory cell transistors M3 and M4 existing the crystal lattice mismatch plane 7 therebetween is larger than the interval S between adjacent two memory cell transistors failing to exist the crystal lattice mismatch plane 7 therebetween. Here, since the crystal lattice mismatch plane 7 is provided at the central portion in the SOI crystal layer, the structure in which the interval S' near the center of the SOI crystal layer (the central portion of the SOI crystal layer in the bit line direction) is rendered larger than the intervals S in the other regions.

Still another modification of the present embodiment is shown in FIGS. 4A and 4B. When the structure in FIGS. 3A and 3B (the structure in which the intervals S and S' of the adjacent memory cell transistors are adjusted) is applied to the modification in FIGS. 2A and 2B, since a diffusion layer formed in the region of the larger interval S' is easily expanded in the lateral direction, the memory cell transistors M3 and M4 provided in the both sides of the larger interval S' may have the transistor characteristics different from those of the other memory cell transistors M1, M2, M5 and M6. In order to avoid this, as shown in FIGS. 4A and 4B, the gate length L' of the memory cell transistors M3 and M4 in the both side of the large interval S' may be rendered longer than the gate length L of the other memory cell transistors.

A method for manufacturing the semiconductor device of the first embodiment is described by using FIGS. 5A to 5C to FIGS. 10A to 10C.

Figure 5A:
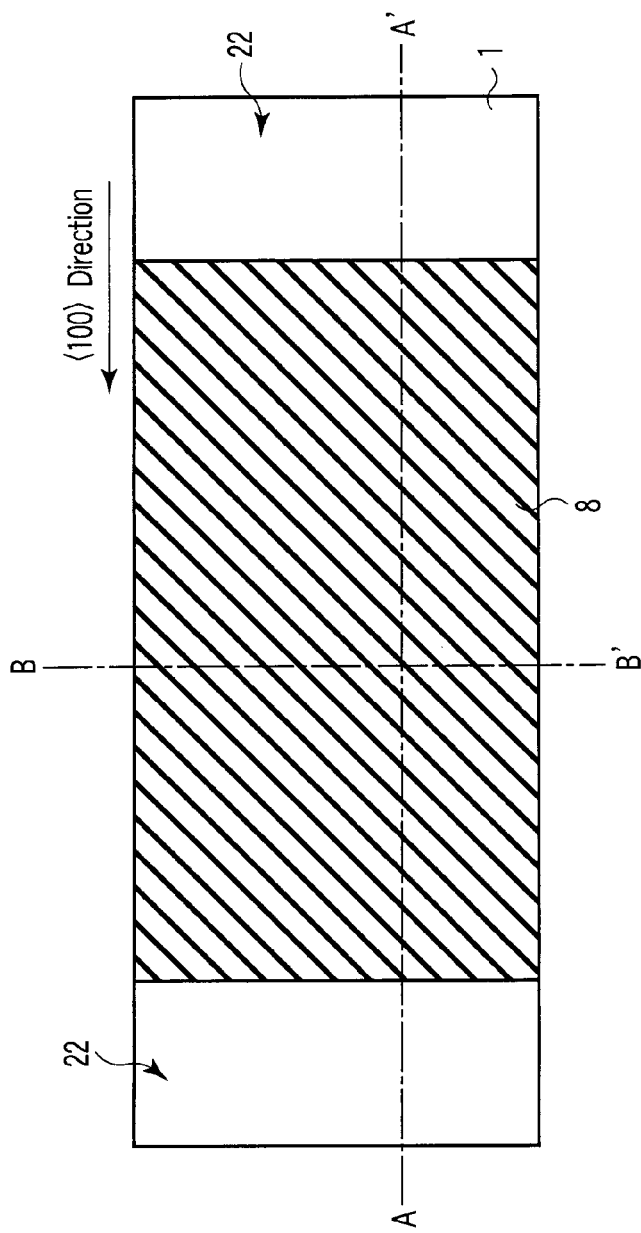
FIGS. 5A to 5C are a plan view and cross-sectional views for explaining a method for manufacturing the semiconductor device of the first embodiment.
Figure 5C:
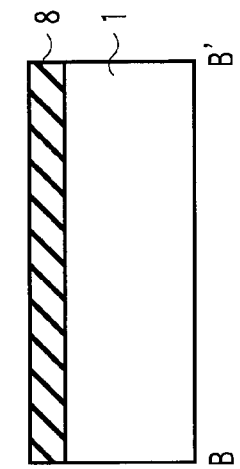
Figure 5B:
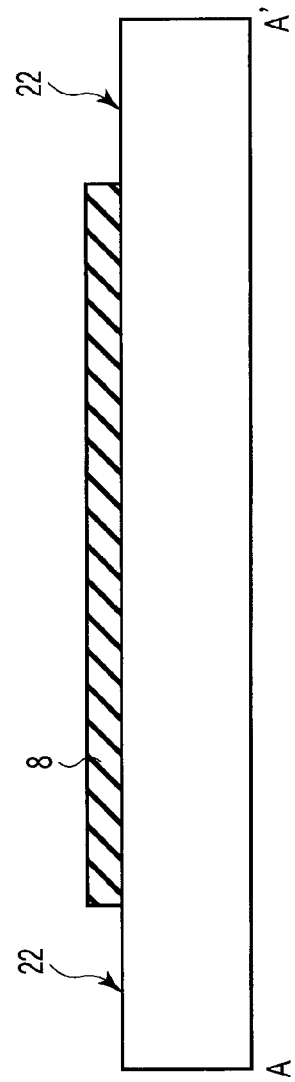

FIG. 5A is a plan view, and FIG. 5B is an A-A' cross-sectional view of FIG. 5A, that is, the cross-sectional view in the channel length direction (bit line direction). FIG. 5C is a B-B' cross-sectional view of FIG. 5A, that is, the cross-section view in the channel width direction (word line direction). The same holds for FIGS. 6A to 6C to FIGS. 10A to 10C.

[FIGS. 5A to 5C]

A silicon oxide film to be the buried insulator 8 by using thermal oxidation method and has a thickness of 50 nm, is formed on the surface of the p-type silicon crystal substrate 1.

A part of the region of the silicon oxide film is removed, by using a resist (not shown) having a shape with a pair of sides extending to a direction orthogonal to a <100> direction as a mask, to expose a part of the surface 22 of the silicon crystal substrate 1. The exposed surfaces 22 (substrate exposed portions) act as seed portions in the so-called solid phase epitaxial growth. Here, the distance between the adjacent substrate exposed portions 22 is 5 μm.

[FIGS. 6A to 6C]

A silicon amorphous layer 21a to be the SOI crystal layer is deposited on the region containing the substrate exposed portions 22 and the silicon oxide film 2 by using CVD (Chemical Vapor Deposition) method. The thickness of the silicon amorphous layer 21a is 50 nm, for example.

At this time, the silicon amorphous layer 21a is deposited at a lower temperature, for example, 550° C. or lower such that a micro crystal is less likely to be formed in the silicon amorphous layer 21a.

The thickness of the silicon amorphous layer 21a hardly changes on the silicon oxide film 2 and on the substrate exposed portions 22, and in fact, although the surface of the silicon amorphous layer 21a is not flat, the surface is drawn flat for the ease in the drawing.

[FIGS. 7A to 7C]

Heat treatment at about 600° C. is performed under a nitrogen atmosphere to grow the silicon amorphous layer 21a in solid phase, and thus the silicon amorphous layer 21a is converted into the silicon crystal layer (SOI crystal layer) 21. That is, the silicon amorphous layer 21a is converted into the silicon crystal layer 21 by solid phase epitaxy.

At this time, the solid phase growth progresses in the <100> direction by using the substrate exposed portions 22 provided in the left and right directions as the seed portions, and thus long solid phase growth distance of about several μm can be realized, whereby the silicon amorphous layer 21a in the entire formation region of the memory cell transistor can be converted into the silicon crystal layer 21.

In addition, since the solid phase growth rate is substantially equal in the left and right substrate exposed portions 22, the silicon crystal layers 21 extending from either side of the substrate exposed portions 22 are collided with each other at near an substantially intermediate position between the left and right substrate exposed portions 22, and thus a crystal interface is formed.

At this time, since the solid phase growth distance is set to as long as 2.5 μm, the crystal lattice face in the front end region of the silicon crystal layer 21 is shifted by about 3 degrees to the crystal lattice surface of the silicon crystal substrate 1. The shift angles of the crystal lattice surface are substantially symmetric to each other across the above mentioned crystal interface. Thus the crystal interface becomes the crystal lattice mismatch plane 7 with the shift angle of about 6 degrees in the crystal lattice surface.

Here, it is experimentally confirmed that the effect of the present embodiment for rapidly eliminating the electric charge in the SOI crystal layer appears when the shift angle in the left and right crystal lattice surfaces is not less than 1 degree. In order to obtain this effect, typically, the solid phase growth distance may be not less than 1 μm.

Further, in order to surely avoid the memory malfunction occurring with the electrical potential fluctuation of the SOI crystal layer, it is desirable that the shift angle in the left and right lattice surfaces is not less than 5 degrees. Therefore, it is desirable that the solid phase growth distance is typically longer than 2 μm.

It is considered that the generation of shift angle in the crystal lattice is caused by the generation of different internal stresses in the upper and lower regions in the silicon crystal layer 21. Therefore, the internal stresses generated in left and right solid phase growth layers is changed by changing the thickness of the silicon amorphous layer 21a in the left and right region or changing impurity element concentrations, whereby the shift angles in the left and right lattice surfaces can be increased.

Figure 8A:
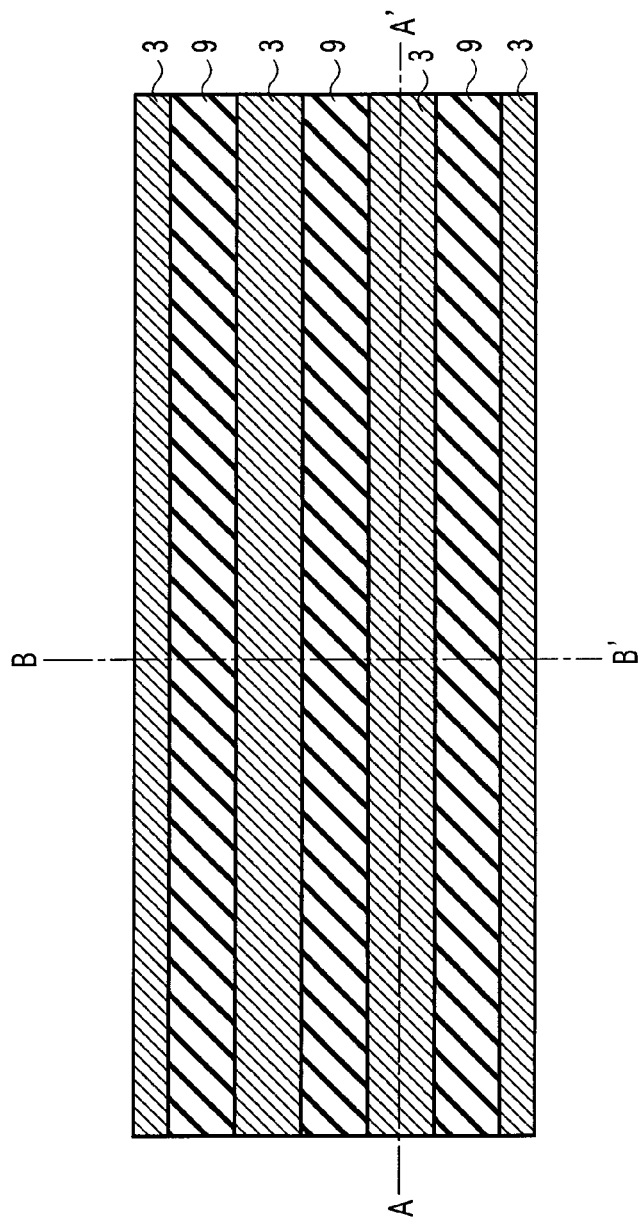
FIGS. 8A to 8C are a plan view and cross-sectional views for explaining the method for manufacturing the semiconductor device of the first embodiment following FIGS. 7A to 7C.
Figure 8C:
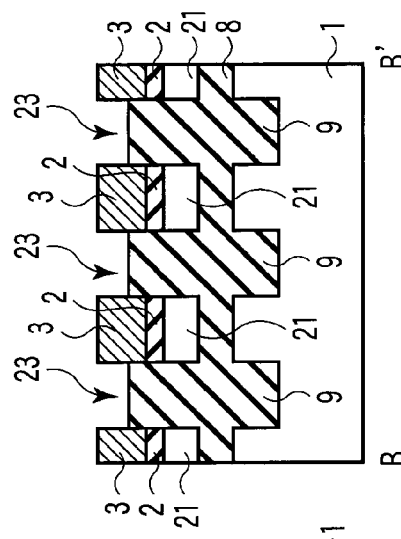
Figure 8B:
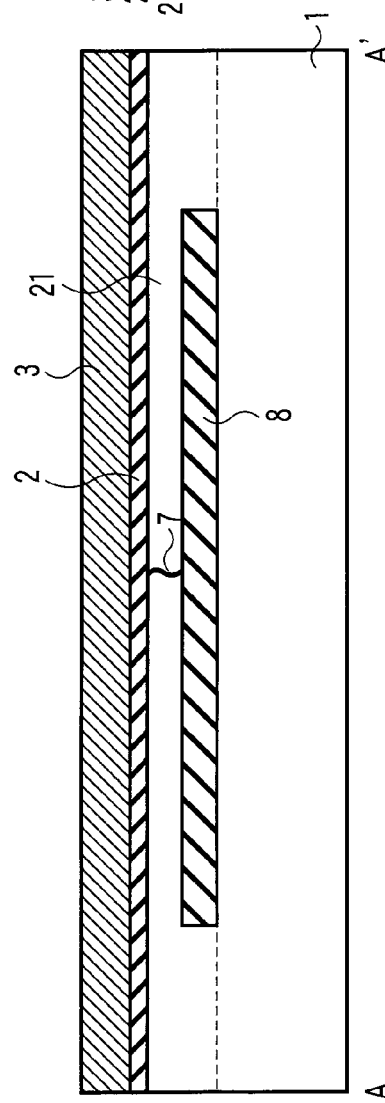

[FIGS. 8A to 8C]

The tunnel insulation film 2 is formed on the silicon crystal layer 21 by using radical oxidation method. The thickness of the tunnel insulation film 2 is 7 nm, for example. A phosphorus-doped polycrystalline silicon layer 3 to be the floating gate electrode is formed on the tunnel insulation film 2 by using film-formation method such as CVD method. The thickness of the phosphorus-doped polycrystalline silicon layer 3 is about 50 nm, for example. A polycrystalline silicon layer, to which dopant except phosphorous is doped, may be used.

The phosphorus-doped polycrystalline silicon layer 3, the tunnel insulation film 2, the silicon crystal layer 21, the buried insulator 8 and the silicon crystal substrate 1 are partially removed by RIE (Reactive Ion Etching) method or the like with the use of a resist (not shown) patterned in a stripe shape as a mask, and thus to form isolation trench 23.

The isolation trench 23 is filled with buried insulator (isolation insulating films) 9 by using coating method or the like. At this time, for instance, a coating insulation film such as a polysilazane film is applied, and thus to be able to prevent the formation of a region where the filling is incomplete, that is, a so-called void.

As the dielectric constant of the buried insulator 9 is lower, a breakdown voltage between the adjacent memory cells is enhanced, it is desirable that steam oxidation is performed after applying the coating insulation film to desorb nitrogen and impurities such as carbon and hydrogen in the coating insulation film, and thus to convert the coating insulation film into the silicon oxide film.

In addition, in order to repair crystal defects generated on a surface portion of the isolation trench 23 in formation thereof, the thermal oxidation or radical oxidation may be applied onto the trench surface portion before or after filling the isolation trench 23 with the coating insulation film.

Further, in order to enhance the insulation property of the buried insulator 9, CVD insulation film and the coating insulation film may be combined for filling the isolation trench 23. The order of the formation of the CVD insulation film and the coating insulation film is not specifically limited.

[FIGS. 9A to 9C]

The inter-electrode insulation film 4 is formed on the phosphorus-doped polycrystalline silicon layer 3 by ALD (Atomic Layer Deposition) method or the like. Here, an alumina film is used as the inter-electrode insulation film 4. The thickness of the alumina film is about 15 nm, for example. The insulation films other than the alumina film can be used as the inter-electrode insulation film 4.

The inter-electrode insulation film 4 is etched by RIE method or the like with the use of a patterned resist (not shown) as a mask, and thus slit parts 24 having a width of about 50 nm are formed in a prospective region where the select gate transistor will be formed, whereby the phosphorus-doped polycrystalline silicon layer 3 is partially exposed.

[FIGS. 10A to 10C]

A tungsten silicide layer to be the control gate electrode 5 is formed on the phosphorus-doped polycrystalline silicon layer 3 and the inter-electrode insulation film 4 by spatter method or the like. Conducting layers except the tungsten silicide layer can be used.

At this time, the phosphorus-doped polycrystalline silicon layer 3 and the tungsten silicide layer are electrically connected in the slit parts 24.

The tungsten silicide layer, the alumina film and the phosphorus-doped polycrystalline silicon layer 3 are etched by RIE method or the like with the use of a resist (not shown) patterned in a stripe shape as a mask, and thus to form a two-layer gate structure 11 of the memory cell transistor and a stacked gate electrode structure 12 of the select gate transistor.

The n-type impurity diffusion layer 6 having an intended impurity concentrations distribution is formed by combining ion implantation method and thermal diffusion method or the like.

Thereafter, well-known steps such as a step of forming an interlayer insulation film covering the memory cell transistor by CVD method and like, a step of forming a buried layer (plug) for the bit line contact (and the source line contact) by forming an opening to the impurity diffusion layer of the select gate transistor and burying a conductor such as tungsten in the opening are performed, thereby the nonvolatile memory cell is completed.

In the above embodiment, although the method for manufacturing the memory cell wherein the floating gate electrode is an electric charge accumulation layer has been described, the similar method can be applied to other nonvolatile memory cells such as an MONOS (Metal-Oxide-Nitride-Oxide-Semiconductor) type nonvolatile memory cell in which an insulation film such as a silicon nitride film is the electric charge accumulation layer.

According to the manufacturing method of the present embodiment, since the solid phase growth progresses in the <100> direction, the long solid phase growth distance of several μm can be realized, and thus to be able to easily convert the entire memory cell transistor formation region into the silicon crystal layer 21, while the crystal lattice mismatch plane 7 can be formed at approximately intermediate position between the left and right substrate exposed portions 22.

In the present embodiment, the memory cell array is constituted of an n-channel transistor (the carrier is electron), however, when it is constituted of a p-channel transistor (the carrier is hole), the channel direction is the <100> direction, the carrier mobility is enhanced, and at the same time, the speed-up of the memory operation can be realized.

In addition, heat treatment condition or the film thickness of the silicon amorphous layer 21a are set so that the solid phase epitaxial growth distance is not larger than half of the interval between the left and right substrate exposed portions 22, whereby the silicon crystal layer (SOI crystal layer) 21 having the plurality of crystal lattice mismatch planes 7 can be formed as shown in FIGS. 11A to 11C.

Moreover, in the manufacturing method of the present embodiment, the formation method of the tunnel insulation film 2 adopts the radical oxidation method. Therefore, it is possible to reduce the locally thinning of the tunnel insulation film 2 formed on the crystal lattice mismatch planes 7. Further, it is possible to reduce the formation of the micro concavoconvex shape on the surface of the SOI crystal layer 21. As a result, the fluctuation in the writing/erasing properties of the memory cell transistor formed on the crystal lattice mismatch plane 7 is reduced, and thus to be able to avoid the memory malfunction. In order to obtain this effect, the deposition method such as ALD method may be used instead of radical oxidation method in which oxygen radical is a major oxidizing species.

Furthermore, in the manufacturing method of the present embodiment, the silicon amorphous layer 21a is deposited, and then subjected to solid phase growth, and thus is converted into the silicon crystal layer, however, a silicon layer such as an amorphous silicon layer containing a micro crystal or a silicon layer such as a polycrystalline silicon layer may be deposited instead of the silicon amorphous layer. In this case, the silicon layer is preferably rendered amorphous by ion implantation method or the like before the crystallization heat treatment.

Second Embodiment

A method for manufacturing a semiconductor device of a second embodiment is described by using FIGS. 12A to 12C to FIGS. 14A to 14C.

FIG. 12A is a plan view, FIG. 12B is a cross-sectional view taken along a line A-A' in FIG. 12A, and FIG. 12C is a cross sectional view taken along a line B-B' in FIG. 12A. The same holds for FIGS. 13A to 13C to FIGS. 14A to 14C.

The same components as those in the foregoing drawings are assigned the same reference numerals and detailed explanations thereof are omitted (the same manner is applied to the drawings to be described hereinafter).

In the present embodiment, a manufacturing method capable of controlling the formation position of the crystal lattice mismatch plane in the first embodiment is described.

[FIGS. 12A to 12C]

At first, the structure shown in FIGS. 5A to 5C is formed by the same method of the first embodiment, thereafter, the silicon amorphous layer 21a is deposited on a region containing the substrate exposed portions 22 and the silicon oxide film 2 by CVD method. The thickness of the silicon amorphous layer 21a is 50 nm, for example.

At this time, the deposition temperature of the silicon amorphous layer 21a is set to at least 550° C. such that micro crystals 25 are respectively formed in the silicon amorphous layer 21a and on the interface between the silicon amorphous layer 21a and the buried insulator 8. In FIG. 12B, the micro crystals 25 in the silicon amorphous layer 21a are represented by black squares, the micro crystals 25 on the interface between the silicon amorphous layer 21a and the buried insulator 8 are represented by black triangles.

The thickness of the silicon amorphous layer 21a hardly changes on the silicon oxide film 2 and on the substrate exposed part 22, and in fact, although the surface of the silicon amorphous layer 21a is not flat, the surface is drawn flat for the ease in the drawing.

[FIGS. 13A to 13C]

A resist 26 is formed on a region of the silicon amorphous layer 21a, where the crystal lattice mismatch plane is desired to be formed. In the present embodiment, the resist 26 is formed at an substantially intermediate position between the pair of seed portions (substrate exposed portions)

Silicon element (implantation element) 27 is ion-implanted into the entire surface of the silicon amorphous layer 21a.

At this time, with regards to the ion implantation acceleration energy, the range of silicon ion is set to not less than the thickness of the silicon amorphous layer 21a, and ion implantation dose amount is set to be high enough to render the micro crystal 25 amorphous. Further, the thickness of the resist 26 is set to a level to prevent the implanted ions from passing through the resist 26.

As a result, the micro crystal 25 in the region uncovered by the resist 26 is rendered amorphous, the micro crystal 25 remains only in the region covered by the resist 26.

[FIGS. 14A to 14C]

After the removal of the resist 26, the heat treatment at about 600° C. is performed under the nitrogen atmosphere to grow the silicon amorphous layer 21a in solid phase, and thus the silicon amorphous layer 21a is converted into the silicon crystal layer 21.

At this time, the solid phase growth progresses in the <100> direction by using the substrate exposed portions 22, provided in the left and right directions, as the seed portions, and therefore, the long solid phase growth distance of about several μm can be realized, whereby the entire region uncovered by the resist 26 in the memory cell transistor formation region can be converted into the silicon crystal layer 21. Further, in the region covered by the resist 26, since the remained micro crystals 25 act as seeds for crystal growth, a plurality of crystal grains 28 are formed. As a result, the crystal lattice mismatch planes 7 are formed in the region covered by the resist 26.

In the present embodiment, although the resist 26 is used for the ion-implantation into the predetermined region, another method capable of selectively ion-implanting may be used.

Additionally, the silicon element is ion-implanted in the present embodiment, it is desirable in that the silicon element is less likely to vary electrical properties of the silicon crystal substrate 1. However, the implanted element is not limited to the silicon element. For example, when an element heavier than the silicon element is selected as the implanted element, the micro crystal is easily rendered amorphous, whereby the dose amount can be reduced. Meanwhile, an element belonging to the same group as silicon is selected as the implanted element whereby it is possible to minimize the fluctuation of the electrical properties of the silicon crystal substrate 1. Accordingly, the element, which is heavier than silicon and belongs to the same group as silicon, as with germanium or the like is used, whereby it is possible to realize the amorphization at short times, while minimizing the fluctuation of the electrical property of the silicon crystal substrate 1.

Third Embodiment

FIGS. 15A and 15B are cross-sectional views showing a semiconductor device according to the third embodiment. FIG. 15A is the cross-sectional view in the channel length direction (bit line direction), and FIG. 15B is the cross-sectional view in the channel width direction (word line direction). Here, FIG. 15B is a cross-sectional view in a surface orthogonal to the drawing and taken along a line B-B' in FIG. 15A.

In the present embodiment, the different point from the first embodiment is a direction of the crystal lattice mismatch plane 7 provided in the SOI crystal later (silicon crystal layer). The present embodiment has one or a plurality of crystal lattice mismatch planes 7 running in a memory cell transistor array direction (bit line direction) (an example is shown in FIGS. 15A and 15B). That is, one or a plurality of crystal lattice mismatch planes 7 crossing the silicon crystal layer 21 along the world line direction (second direction) penetrate through the silicon crystal layer 21 in the film thickness direction of the silicon crystal layer 21 in the cross-section of the channel width direction, and as viewed from the top of the silicon crystal layer 21, one or a plurality of crystal lattice mismatch planes 7 are formed so as to pass under the gate central portions of the plurality of memory cell transistors M1 to M6 (NAND string) and cross the silicon crystal layer 21 along the bit line direction.

As shown in FIG. 15A, there are the crystal lattice mismatch planes 7 running in the word line direction, but those are not necessary in the present embodiment. Such a crystal lattice mismatch plane 7 may not be formed depending on process.

The structure of the present embodiment can obtain the same effect as those of the first embodiment.

In addition, according to the present embodiment, since the crystal lattice mismatch plane 7 can be provided throughout the inside of the SOI crystal layer, it is possible to effectively eliminate the electric charge in the entire SOI crystal layer.

Moreover, according to the present embodiment, it becomes possible to provide the crystal lattice mismatch plane 7 so as not to cross to the channel length direction of the transistor, whereby the lowering of the carrier mobility can be minimized to realize the transistor high-speed operation.

When the number of the crystal lattice mismatch plane 7 is one, it is possible to avoid the memory malfunction with a minimum of lowering the transistor high-speed operation. When a plurality of crystal lattice mismatch planes 7 are provided, it is possible to effectively eliminate the electric charge in the SOI crystal layer.

In FIGS. 16A and 16B show a modification of the present embodiment. FIGS. 16A and 16B are cross-sectional views each corresponding to FIGS. 15A and 15B. In this modification, the lower region of the gates in the respective memory cell transistors is the p-type impurity diffusion layer 9, the interval region of the adjacent memory cell transistors is the n-type impurity diffusion layer 6. That is, the memory cell transistor of this modification is a cell transistor having a pair of source/drain region.

A method for manufacturing the semiconductor device of the present embodiment is described by using FIGS. 17A to 17C to 21A to 21C.

Figure 17A:
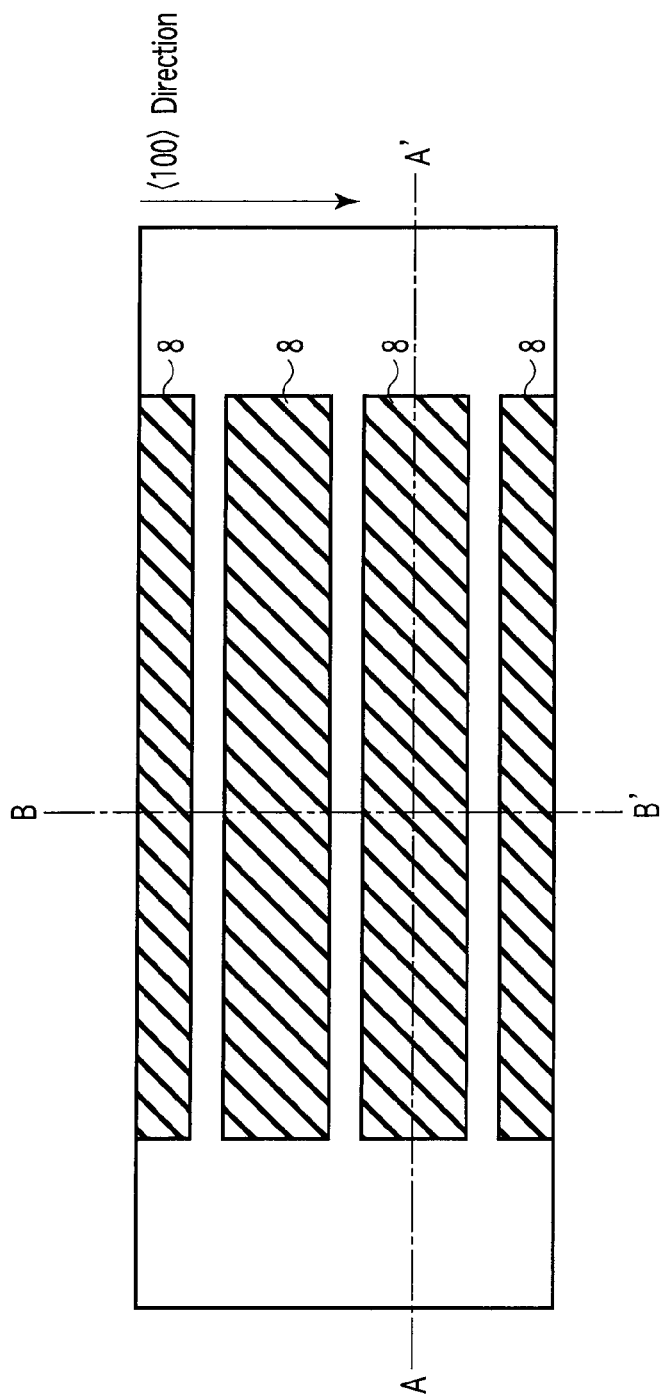
FIGS. 17A to 17C are a plan view and cross-sectional views for explaining a method for manufacturing the semiconductor device of the third embodiment.
Figure 17C:
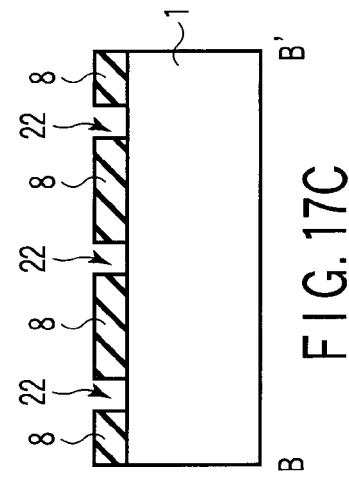
Figure 17B:
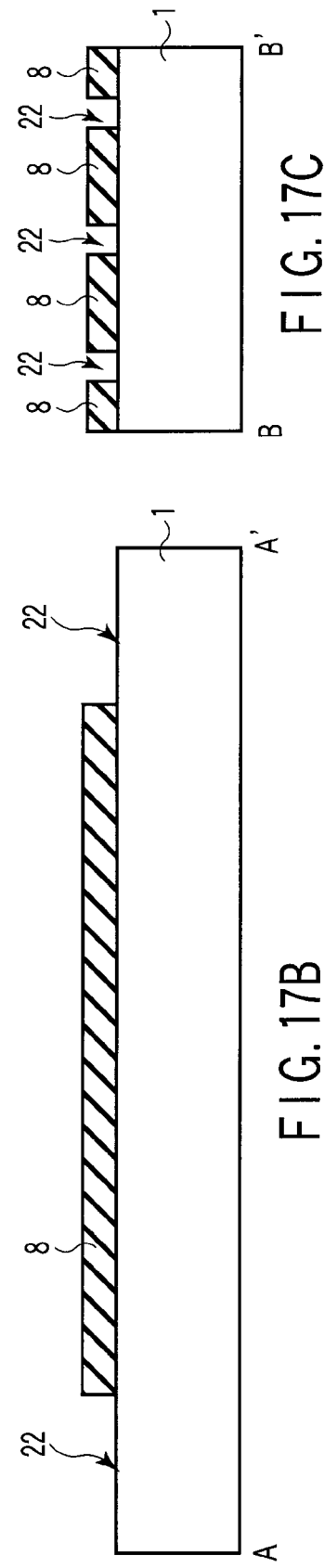

FIG. 17A is a plan view, FIG. 17B is an A-A' cross-sectional view of FIG. 17A, and FIG. 17C is a B-B' cross-sectional view of FIG. 17A. The same holds for FIGS. 18A to 18C to FIGS. 21A to 21C.

[FIGS. 17A to 17C]

Silicon oxide films 8 having a thickness of 50 nm to be the buried insulator is formed on the surface of the p-type silicon crystal substrate 1 by using thermal oxidation method. The silicon oxide film 2 is partially removed by using a resist (not shown) as a mask, which is formed into a shape having a plurality of slits extending to a direction orthogonal to the <100> direction, on the memory cell transistor formation region, and thus to expose the surface 22 which is a part of the silicon crystal substrate 1, in a slit form. The slit-shaped substrate exposed portions 22 functions as the seed portions in the so-called solid phase epitaxial growth. Here, the slit-shaped substrate exposed portions 22 are formed in the formation region of the isolation trench.

Figure 18A:
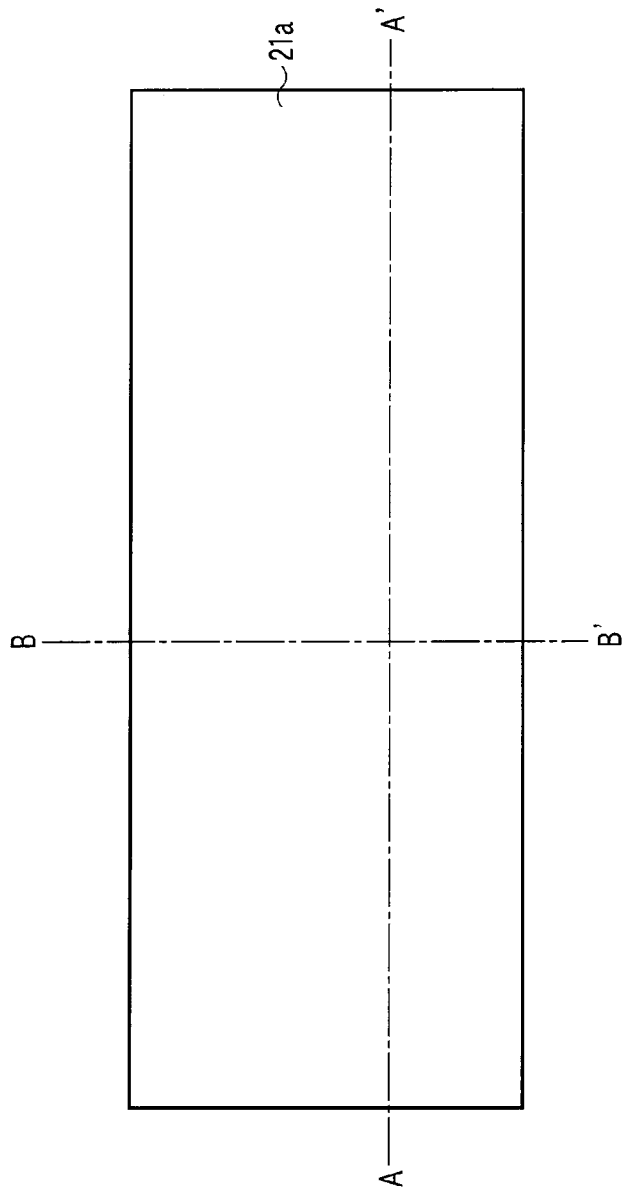
FIGS. 18A to 18C are a plan view and cross-sectional views for explaining the method for manufacturing the semiconductor device of the third embodiment following FIGS. 17A to 17C.
Figure 18C:
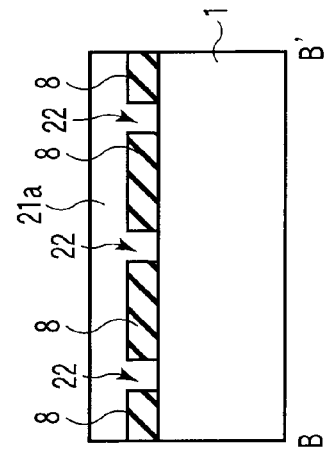
Figure 18B:
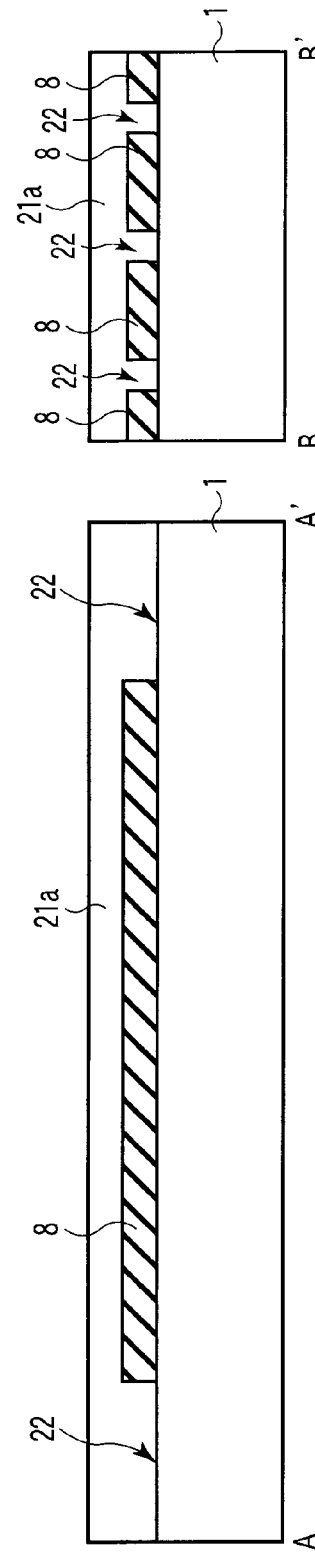

[FIGS. 18A to 18C]

The silicon amorphous layer 21a to be the SOI crystal layer is deposited on the region containing the substrate exposed portions 22 and the silicon oxide films 8 by using CVD method. The thickness of the silicon amorphous layer 21a is 50 nm, for example.

At this time, the silicon amorphous layer 21a is preferably deposited at a lower temperature, for example, 550° C. or lower such that a micro crystal is less likely to be formed in the silicon amorphous layer 21a.

The thickness of the silicon amorphous layer 21a hardly changes on the silicon oxide film 2 and on the substrate exposed portions 22, and in fact, although the surface of the silicon amorphous layer 21a is not flat, the surface is drawn flat for the ease in the drawing.

[FIGS. 19A to 19C]

Heat treatment at about 600° C. is performed under a nitrogen atmosphere to grow the silicon amorphous layer 21a in solid phase, and thus the silicon amorphous layer 21a is converted into the silicon crystal layer (SOI crystal layer) 21.

At this time, the solid phase growth progresses in the <100> direction by using the slit-shaped substrate exposed portions 22 as the seed parts, and thus the long solid phase growth distance of about several μm can be realized, whereby the silicon amorphous layer 21a in the entire formation region of the memory cell transistor can be converted into the silicon crystal layer 21.

In addition, since the solid phase growth rate is substantially equal in the left and right substrate exposed portions 22, the silicon crystal layers 21 extending from either side of the substrate exposed portions 22 are collided with each other at approximately intermediate position between the substrate exposed portions 22, and thus the crystal lattice mismatch planes 7 are formed.

[FIGS. 20A to 20C]

The tunnel insulation film 2 is formed on the silicon crystal layer 21 by using the radical oxidation method. The thickness of the tunnel insulation film 2 is 7 nm, for example. The phosphorus-doped polycrystalline silicon layer 3 to be the floating gate electrode is formed on the tunnel insulation film 2 by using film-formation method such as CVD method. The thickness of the phosphorus-doped polycrystalline silicon layer 3 is about 50 nm, for example.

The phosphorus-doped polycrystalline silicon layer 3, the tunnel insulation film 2, the silicon crystal layer 21, the buried insulator 8 and the silicon crystal substrate 1 are partially removed by RIE method or the like with the use of a resist (not shown) patterned in a stripe shape as a mask, and thus to form isolation trench 23. At this time, the isolation trench 23 is formed in the slit-shaped substrate exposed portions 22.

The buried insulator (isolation insulating film) 9 is buried in the isolation trench 23 by using coating method or the like. At this time, for instance, a coating insulation film such as a polysilazane film is applied, and thus to be able to avoid the formation of a region where the burying is incomplete, that is, the so-called void.

As the dielectric constant of the buried insulator 9 is lower, the breakdown voltage between the adjacent memory cells is enhanced. Therefore, it is desirable that steam oxidation is performed after applying the coating insulation film to desorb nitrogen and impurities such as carbon and hydrogen in the coating insulation film, and thus to convert the coating insulation film into the silicon oxide film.

In addition, in order to repair crystal defects generated on a surface portion of the isolation trench 23 in formation thereof, the thermal oxidation or radical oxidation may be applied onto the trench surface portion before or after burying the isolation trench 23 with the coating insulation film.

Further, in order to enhance the insulation property of the buried insulator 9, the CVD insulation film and the coating insulation film may be combined for burying the isolation trench 23. The order of the formation of the CVD insulation film and the coating insulation film is not specifically limited.

[FIGS. 21A to 21C]

In a similar manner to the first embodiment, the inter-electrode insulation film 4, the control gate electrode 5 and the n-type impurity diffusion layer 6 are formed to complete the nonvolatile memory cell.

In the above embodiment, although the method for manufacturing the memory cell wherein the floating gate electrode is the electric charge accumulation layer has been described, the similar method can be applied to other nonvolatile memory cells such as the MONOS type nonvolatile memory cell in which an insulation film such as a silicon nitride film is the electric charge accumulation layer.

According to the manufacturing method of the present embodiment, it is possible to form the memory cell array having the crystal lattice mismatch plane 7 running to the memory cell transistor array direction (bit line direction).

In addition, heat treatment condition and the film thickness of the silicon amorphous layer 21a are set so that the solid phase epitaxial growth distance is not larger than half of the interval between the left and right substrate exposed portions 22, whereby the SOI crystal layer having the plurality of crystal lattice mismatch plane 7 running to the memory cell transistor array direction (bit line direction) can be formed.

Moreover, in the manufacturing method of the present embodiment, the substrate exposed portions 22 are formed also on the select transistor formation region. Therefore, as shown in FIG. 21B, the crystal lattice mismatch plane 7 is formed also between the select gate transistor and the memory cell transistor. In order to avoid this, as shown in FIGS. 22A to 22C, the buried insulator 8 may be provided also in select gate transistor formation region.

Another method is described as follows.

At first, the buried insulator 8 shown in FIGS. 22A to 22C is formed, thereafter, a first silicon crystal layer is formed on the buried insulator 8. This first silicon crystal layer is formed by vapor phase epitaxial method, for example.

Next, the first silicon crystal layer, the buried insulator 8 and the silicon crystal substrate 1 are etched to form a trench. The bottom of the trench is provided at a position deeper than the lower surface of the buried insulator 8.

Next, the silicon amorphous layer is formed on a region containing the trench and a first trench so that the trench is filled.

Next, the silicon amorphous layer is converted into a second silicon layer by solid phase growth in which the first silicon crystal layer and the side and bottom surfaces of the trench (silicon crystal substrate) are used as the seed portions.

At this time, since the bottom of the trench is positioned deeper than the lower surface of the buried insulator 8, the interface (crystal lattice mismatch plane), which is generated by the collision between the solid phase growth layer proceeding from the silicon crystal layer and the solid phase growth layer proceeding from the side and bottom surfaces of the trench, is formed at a position lower than the upper surface of the buried insulator 8. Therefore, the influence of the above interface (crystal lattice mismatch plane) to the memory cell array portion is sufficiently reduced.

Thereafter, the second silicon crystal layer is removed back until the first silicon crystal layer is exposed.

The above mentioned process is adopted whereby the device structure without the crystal lattice mismatch plane 7 in the word line direction can be realized in the structure shown in FIG. 15A.

Fourth Embodiment

A method for manufacturing a semiconductor device of the fourth embodiment is described by using plan views of FIGS. 23 and 24.

The present embodiment describes a manufacturing method capable of forming the SOI crystal layer, which has the crystal lattice mismatch plane at near the center (central part) in the memory cell transistor array direction (bit line direction (channel length direction)), over the entire region of the memory cell array portion in the first embodiment.

[FIG. 23]

A memory cell array formation region 30 with a rectangular shape of which one side directs to the <100> direction is set on the surface of the silicon crystal substrate 1.

Here, the length of the side of the memory cell array formation region 30 in the <100> direction is set as a, the length of a side thereof orthogonal to the <100> direction is set as b. In the present embodiment, although the two memory cell array formation regions 30 are repeated, one or at least three memory cell array formation regions 30 may be provided.

The pair of substrate exposed portions 22 as the seed portions which extend to a direction orthogonal to the <100> direction so as to sandwich the memory cell array formation region 30, are formed so as to be protruded from the memory cell array formation region 30 only by distances c1 and c2 in either side. Here, c1>a/2 and c2>a/2. Although the magnitude relation between c1 and c2 is not limited especially, c1=c2, for example.

In the present embodiment, although one substrate exposed part 22 is common between the two memory cell array formation regions 30 provided on the both sides, a pair of substrate exposed portions 22 may be provided in each memory cell array formation region 30.

[FIG. 24]

The silicon amorphous layer is deposited on the entire surface so as to cover the memory cell array formation regions 30 and the substrate exposed portions 22, thereafter, the silicon amorphous layer is grown in solid phase mainly in the <100> direction by heating, whereby the above mentioned silicon layer is converted into the silicon crystal layer (SOI crystal layer) 21.

At this time, since the solid phase growth progresses from the substrate exposed portions 22 on both sides, the crystal lattice mismatch plane 7 shown by a heavy line in FIG. 24 is formed, the silicon crystal layer (SOI crystal region) 21 is formed in the region surrounded by the crystal lattice mismatch plane 7. Then a silicon polycrystalline region 29 is formed outside of the silicon crystal layer 21. That is, the silicon crystal layer 21 can be formed over the entirety of the memory cell array formation regions 30.

Thereafter, the buried insulator 9 (isolation region), the memory cell transistors, the word line, and the like are formed by the method described in the first embodiment or other methods to complete the memory cell array portion.

According to the present embodiment, it is possible to form the silicon crystal layer (SOI crystal region) 21 having crystal lattice mismatch plane 7 near the center in the memory cell transistor array direction (bit line direction and channel length direction) over the entire memory cell array portion. As a result, high-speed operation in all the memory cell transistors constituting the memory cell array portion and avoiding of the memory malfunction can be realized simultaneously.

In the normal formation of the memory cell array portion, as shown in FIG. 24, word line leading portions 31 are provided in one side (or both sides) of the memory cell array portion. In the present embodiment, the distance c1 (and c2) can be set so that the word line leading portions 31 can also be formed on the SOI crystal region. As a result, the parasitic capacity of the word line is reduced to avoid signal propagation delay, and thus to realize the memory high-speed operation.

Fifth Embodiment

Figure 25:
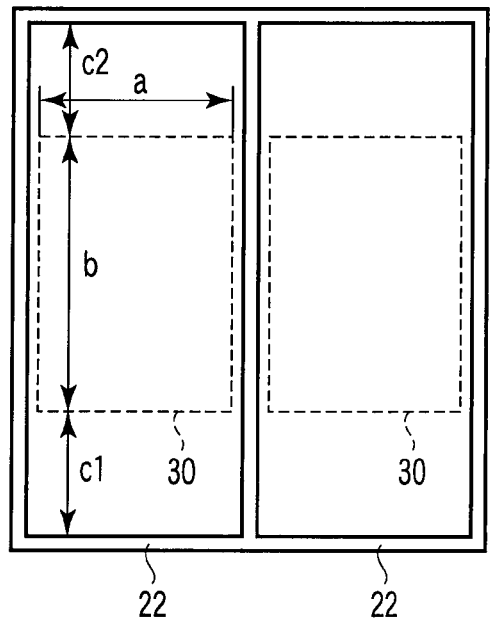
FIG. 25 is a plan view for explaining a method for manufacturing a semiconductor device of a fifth embodiment.
Figure 26:
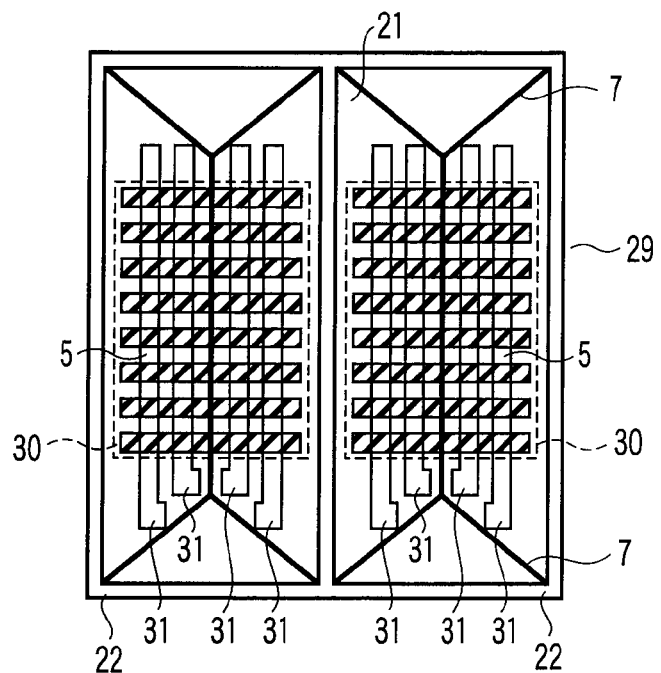
FIG. 26 is a plan view for explaining the method for manufacturing the semiconductor device of the fifth embodiment following FIG. 25.
Figure 27B:
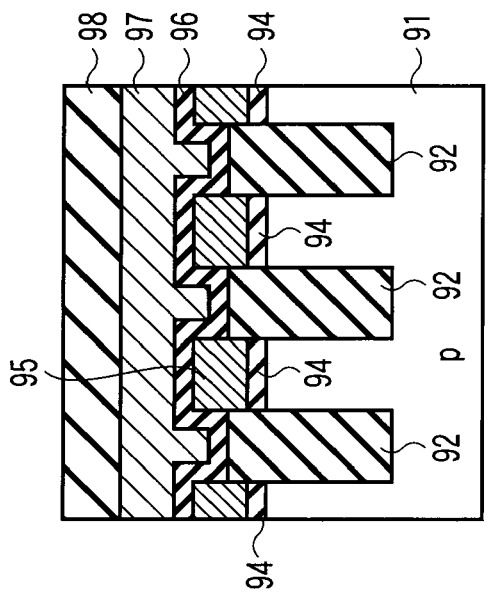
FIGS. 27A and 27B are cross-sectional views showing the conventional nonvolatile semiconductor memory device.
Figure 27A:
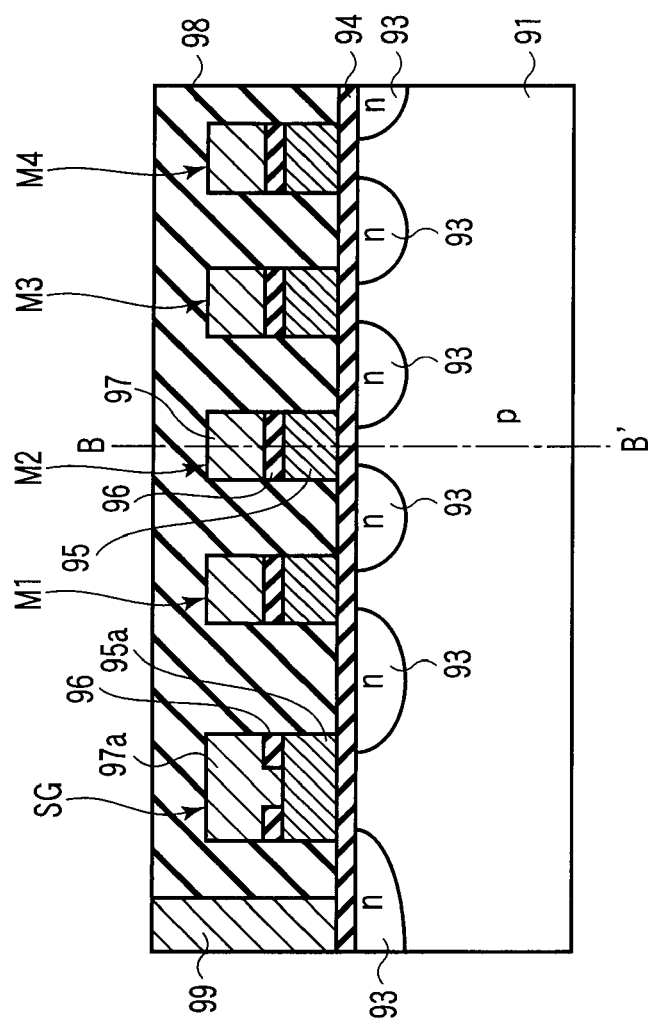

A method for manufacturing a semiconductor device of the fifth embodiment is described by using the plan views of FIGS. 25 and 26.

The present embodiment describes another manufacturing method capable of forming the SOI crystal layer which has the crystal lattice mismatch plane at near the center (central part) in the memory cell transistor array direction (bit line direction (channel length direction)), on the entire region of the memory cell array portion in the first embodiment.

[FIG. 25]

In the fourth embodiment, the substrate exposed portions 22 are provided in the left and right sides of the memory cell array formation region 30, but in the present embodiment, they are provided so as to surround vertical and horizontal peripheries of the memory cell array formation region 30.

The memory cell array formation region 30 with a rectangular shape of which one side directs to the <100> direction is set on the surface of the silicon crystal substrate 1.

Here, the length of the side of the memory cell array formation region 30 in the <100> direction is set as a, the length of a side of the memory cell array formation region 30 orthogonal to the <100> direction is set as b. In the present embodiment, although the two memory cell array formation regions 30 are repeated, one or at least three memory cell array formation regions 30 may be provided.

The substrate exposed portion 22 as the seed portion, which surrounds the outside of the memory cell array formation region 30 and has a rectangular shape with a side (long side) extending to a direction orthogonal to the <100> direction, is formed. Here, the side (long side) extending to a direction orthogonal to the <100> direction is formed so as to be protruded from the both sides of the memory cell array formation region 30 only by distances c1 and c2, respectively, and c1>a/2 and c2>a/2.

In the present embodiment, although the side extending to the direction orthogonal to the <100> direction is common between the two memory cell array formation regions 30 provided on the both sides, a pair of substrate exposed portions 22 may be provided in each memory cell array formation region 30.

[FIG. 26]

The silicon amorphous layer is deposited on the entire surface to cover the memory cell array formation regions 30 and the substrate exposed portions 22, thereafter, the silicon amorphous layer is grown in solid phase mainly in the <100> direction by heating, whereby the above mentioned silicon layer is converted into the silicon crystal layer (SOI crystal layer) 21.

At this time, since the solid phase growth progresses from each side of the rectangular seed portion, the crystal lattice mismatch planes 7 shown by a heavy line in FIG. 26 are formed. The silicon crystal layer (SOI crystal region) 21 is formed in the region surrounded by the crystal lattice mismatch plane 7. A silicon polycrystalline region 29 is formed outside of the silicon crystal layer 21. That is, the silicon crystal layer 21 can be formed over the entirety of the memory cell array formation regions 30.

Thereafter, the buried insulator 9 (isolation region), the memory cell transistors, the word line, and the like are formed by the method described in the first embodiment or other methods to complete the memory cell array portion.

According to the present embodiment, it is possible to form the silicon crystal layer (SOI crystal region) 21, which has the crystal lattice mismatch plane 7 near the center in the memory cell transistor array direction (bit line direction and channel length direction), over the entire memory cell array portion. As a result, high-speed operation in all the memory cell transistors constituting the memory cell array portion and avoiding of the memory malfunction can be realized simultaneously.

Further, According to the present embodiment, the rectangular seed portions are repeated in vertical and horizontal directions in FIG. 25 whereby the SOI crystal layer can be formed on the entire surface of the silicon crystal substrate.

In the normal formation of the memory cell array portion, word line leading portions 31 are provided in one side (or both sides) of the memory cell array portion, as shown in FIG. 25. In the present embodiment, the distance c1 (and c2) can be set so that the word line leading portion 31 can also be formed on the SOI crystal region. As a result, the parasitic capacity of the word line is reduced to avoid signal propagation delay, and thus to realize the memory high-speed operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon crystal layer formed on an insulating layer, the silicon crystal layer containing a crystal lattice mismatch plane;
   a memory cell array portion formed on the silicon crystal layer, the memory cell array portion comprising a plurality of memory strings, each of the plurality of memory strings comprising a plurality of nonvolatile memory cell transistors connected in series in a first direction, the plurality of memory strings being arranged in a second direction orthogonal to the first direction;
   the crystal lattice mismatch plane crossing the silicon crystal along the second direction without passing under gates of the plurality of nonvolatile memory cell transistors as viewed from a top of the silicon crystal layer, or crossing the silicon crystal along the first direction with passing under gates of the plurality of nonvolatile memory cell transistors as viewed from the top of the silicon crystal layer.

2. The semiconductor device according to claim 1, in a case where the crystal lattice mismatch plane crossing the silicon crystal along the second direction penetrates through the silicon crystal layer in a film thickness direction thereof, an interval between adjacent two nonvolatile memory cell transistors with the crystal lattice mismatch plane therebetween is larger than an interval between adjacent two nonvolatile memory cell transistors without the crystal lattice mismatch plane therebetween.

3. The semiconductor device according to claim 1, wherein the crystal lattice mismatch plane is an interface formed by collision of two crystals having different crystal orientations, an interface of two crystals which orientations being shifted each other, an interface formed by collision of two crystals having different crystal lattice spacing, or an interface formed by shift of a part of a crystal along its crystal lattice plane.

4. The semiconductor device according to claim 2, wherein the crystal lattice mismatch plane is an interface formed by collision of two crystals having different crystal orientations, an interface of two crystals which orientations being shifted each other, an interface formed by collision of two crystals having different crystal lattice spacing, or an interface formed by shift of a part of a crystal along its crystal lattice plane.

5. The semiconductor device according to claim 1, wherein the silicon crystal layer further contain another crystal lattice mismatch plane, the another crystal lattice mismatch plane crosses the silicon crystal along the second direction without passing under gates of the plurality of nonvolatile memory cell transistors as viewed from a top of the silicon crystal layer, or crosses the silicon crystal along the first direction with passing under gates of the plurality of nonvolatile memory cell transistors as viewed from the top of the silicon crystal layer.

6. The semiconductor device according to claim 2, wherein the silicon crystal layer further contain another crystal lattice mismatch plane, the another crystal lattice mismatch plane crosses the silicon crystal along the second direction without passing under gates of the plurality of nonvolatile memory cell transistors as viewed from a top of the silicon crystal layer, or crosses the silicon crystal along the first direction with passing under gates of the plurality of nonvolatile memory cell transistors as viewed from the top of the silicon crystal layer.

7. The semiconductor device according to claim 1, wherein the gates of the plurality of nonvolatile memory cell transistors is floating gate electrodes.

8. The semiconductor device according to claim 2, wherein the gates of the plurality of nonvolatile memory cell transistors is floating gate electrodes.

9. A method for manufacturing a semiconductor device comprising:
    setting a nonvolatile memory cell transistor formation region on a silicon crystal substrate, the nonvolatile memory cell transistor formation region having a rectangular shape of which one side directs to <100> direction;
    forming an insulating layer on the silicon crystal substrate;
    exposing a part of the silicon crystal substrate by etching the insulating layer, the exposed part of the silicon crystal substrate being a pair of regions extending to a direction orthogonal to the <100> direction so as to sandwich the nonvolatile memory cell transistor formation region;
    depositing a silicon layer on a region including the exposed part of the silicon crystal substrate and the insulating layer;
    converting the silicon layer into a silicon crystal layer by solid phase epitaxy using the exposed part of the silicon crystal substrate as a seed portion; and
    forming a memory cell array portion comprising a plurality of memory strings on the silicon crystal layer on the nonvolatile memory cell transistor formation region, each of the plurality of memory strings comprising a plurality of nonvolatile memory cell transistors connected in series in the <100> direction, the plurality of memory strings being arranged in a direction orthogonal to the <100> direction.

10. The method for manufacturing a semiconductor device according to claim 9, further comprises performing ion implantation to the silicon layer except a central region between the pair of the region, the performing the ion implantation is performed between at a time of the depositing the silicon layer and at a time of the converting the silicon layer into the silicon crystal layer.

11. A method for manufacturing a semiconductor device comprising:
    setting a nonvolatile memory cell transistor formation region on a silicon crystal substrate, the nonvolatile memory cell transistor formation region having a rectangular shape of which one side directs to <100> direction;
    forming an insulating layer on the silicon crystal substrate;
    exposing a part of the silicon crystal substrate by etching the insulating layer, the exposed part of the silicon crystal substrate being a region surrounding outside of the nonvolatile memory cell transistor formation region and having a rectangular shape with a side extending to a direction orthogonal to the <100> direction;
    depositing a silicon layer on a region including the exposed part of the silicon crystal substrate and the insulating layer;
    converting the silicon layer into a silicon crystal layer by solid phase epitaxy using the exposed part of the silicon crystal substrate as a seed portion; and
    forming a memory cell array portion comprising a plurality of memory strings on the silicon crystal layer on the nonvolatile memory cell transistor formation region, each of the plurality of memory strings comprising a plurality of nonvolatile memory cell transistors connected in series in the <100> direction, the plurality of memory strings being arranged in a direction orthogonal to the <100> direction.

* * * * *

UNITED STATES PATENT AND TRADEMARK OFFICE
CERTIFICATE OF CORRECTION

PATENT NO. : 7,879,658 B2  
APPLICATION NO. : 12/040224  
DATED : February 1, 2011  
INVENTOR(S) : Ozawa et al.

Page 1 of 1

It is certified that error appears in the above-identified patent and that said Letters Patent is hereby corrected as shown below:

Claim 5, column 18, line 65, change "contain" to --contains--.

Claim 6, column 19, line 8, change "contain" to --contains--.

Claim 7, column 19, line 19, change "is floating" to --are floating--.

Claim 8, column 19, line 22, change "is floating" to --are floating--.

Signed and Sealed this  
Sixteenth Day of August, 2011

David J. Kappos  
*Director of the United States Patent and Trademark Office*